United States Patent
Moran et al.

(10) Patent No.: US 8,652,345 B2
(45) Date of Patent: Feb. 18, 2014

(54) METHOD OF FORMING A PATTERNED SUBSTRATE

(75) Inventors: Cristin E. Moran, St. Paul, MN (US); Matthew H. Frey, Cottage Grove, MN (US); Matthew S. Stay, St. Paul, MN (US); Mikhail L. Pekurovsky, Bloomington, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 402 days.

(21) Appl. No.: 13/000,828

(22) PCT Filed: May 26, 2009

(86) PCT No.: PCT/US2009/045120
§ 371 (c)(1),
(2), (4) Date: Dec. 22, 2010

(87) PCT Pub. No.: WO2010/002519
PCT Pub. Date: Jan. 7, 2010

(65) Prior Publication Data
US 2011/0100957 A1    May 5, 2011

Related U.S. Application Data

(60) Provisional application No. 61/076,736, filed on Jun. 30, 2008.

(51) Int. Cl.
*C23F 1/02* (2006.01)
*C23C 18/16* (2006.01)

(52) U.S. Cl.
CPC ......... *C23C 18/1601* (2013.01); *C23C 18/1603* (2013.01); *C23C 18/161* (2013.01)
USPC ................. 216/100; 216/83; 216/88; 216/99; 216/41; 427/402; 427/419.1; 427/256; 427/282; 438/745; 438/734; 438/754

(58) Field of Classification Search
CPC ............ C23C 18/1601; C23C 18/1603; C23C 18/161
USPC .......... 216/83, 88, 99, 100, 41; 438/692, 745, 438/734, 754; 427/256, 282, 402, 419.1
See application file for complete search history.

(56) References Cited

U.S. PATENT DOCUMENTS 3,322,053 A   5/1967   Good
5,137,611 A   8/1992   Roberts et al.
(Continued)

FOREIGN PATENT DOCUMENTS

CN   1909188      2/2007
JP   S51-126344 A   11/1976
(Continued)

OTHER PUBLICATIONS

Brady et al., "Lift-Off Patterning of Metal Films with Metallo-Organic Ink", IBM TDB, vol. 33, No. 8, p. 330-331, Jan. 1991.*

(Continued)

*Primary Examiner* — Lan Vinh
*Assistant Examiner* — David Kaufman
(74) *Attorney, Agent, or Firm* — Steven E. Skolnick; Stephen L. Crooks; Bradford B. Wright

(57) ABSTRACT

A method of forming a patterned substrate is provided. The method includes providing a substrate (300) having a structured surface region comprising one or more recessed features (310). The method includes disposing a first liquid (325) onto at least a portion of the structured surface region. The method includes contacting the first liquid with a second liquid (330). The method includes displacing the first liquid with the second liquid from at least a portion (315) of the structured surface region. The first liquid is selectively located in at least a portion of the one or more recessed features.

20 Claims, 9 Drawing Sheets

(56) References Cited

U.S. PATENT DOCUMENTS

| | | | |
|---|---|---|---|
| 5,300,263 A | 4/1994 | Hoopman et al. | |
| 5,382,317 A | 1/1995 | Thomas | |
| 5,439,621 A | 8/1995 | Hoopman | |
| 5,519,539 A | 5/1996 | Hoopman et al. | |
| 5,670,096 A | 9/1997 | Lu | |
| 5,726,728 A | 3/1998 | Kondo | |
| 5,917,664 A | 6/1999 | O'Neill et al. | |
| 5,970,374 A * | 10/1999 | Teo | 438/629 |
| 6,077,560 A * | 6/2000 | Moshrefzadeh et al. | 427/108 |
| 6,111,696 A | 8/2000 | Allen et al. | |
| 6,198,051 B1 | 3/2001 | Moshrefzadeh et al. | |
| 6,280,063 B1 | 8/2001 | Fong et al. | |
| 6,290,685 B1 | 9/2001 | Insley et al. | |
| 6,354,709 B1 | 3/2002 | Campbell et al. | |
| 6,375,871 B1 | 4/2002 | Bentsen et al. | |
| 6,386,699 B1 | 5/2002 | Ylitalo et al. | |
| 6,431,695 B1 | 8/2002 | Johnston et al. | |
| 6,451,191 B1 | 9/2002 | Bentsen et al. | |
| 6,495,200 B1 * | 12/2002 | Chan et al. | 438/626 |
| 6,521,325 B1 | 2/2003 | Engle et al. | |
| 6,632,343 B1 | 10/2003 | Farnworth et al. | |
| 6,649,249 B1 | 11/2003 | Engle et al. | |
| 7,105,809 B2 | 9/2006 | Wood et al. | |
| 7,160,583 B2 | 1/2007 | Frey et al. | |
| 7,223,364 B1 | 5/2007 | Johnston et al. | |
| 7,235,415 B2 | 6/2007 | Mikoshiba | |
| 7,244,669 B2 | 7/2007 | Sirringhaus et al. | |
| 7,777,832 B2 | 8/2010 | Richard et al. | |
| 2003/0108664 A1 | 6/2003 | Kodas et al. | |
| 2003/0129301 A1 | 7/2003 | Engle et al. | |
| 2003/0203624 A1 * | 10/2003 | Sameshima et al. | 438/687 |
| 2004/0253835 A1 | 12/2004 | Kawase | |
| 2005/0106360 A1 | 5/2005 | Johnston et al. | |
| 2005/0202350 A1 * | 9/2005 | Colburn et al. | 430/320 |
| 2006/0072199 A1 | 4/2006 | Morishita et al. | |
| 2006/0146571 A1 | 7/2006 | Whitney et al. | |
| 2006/0223318 A1 | 10/2006 | Tagawa | |
| 2007/0024994 A1 | 2/2007 | Whitney et al. | |
| 2007/0079869 A1 * | 4/2007 | Yukinobu | 136/263 |
| 2007/0134784 A1 | 6/2007 | Halverson et al. | |
| 2007/0220744 A1 | 9/2007 | Kitaoka | |
| 2007/0231541 A1 | 10/2007 | Humpal et al. | |
| 2010/0270058 A1 | 10/2010 | Mahoney et al. | |

FOREIGN PATENT DOCUMENTS

| | | |
|---|---|---|
| JP | S63-288045 A | 11/1988 |
| JP | 2002 158208 A | 5/2002 |
| JP | 2003-100950 A | 4/2003 |
| JP | 2005-317930 A | 11/2005 |
| RU | 2 230 391 C2 | 6/2004 |
| WO | WO 92/02336 A1 | 2/1992 |
| WO | WO 98/50806 A1 | 11/1998 |
| WO | WO 00/73083 A1 | 12/2000 |
| WO | WO 2010/002679 A2 | 1/2010 |

OTHER PUBLICATIONS

International Search Report, PCT/US2009/045120, mailed Sep. 25, 2009, 4 pages.

Written Opinion of the International Searching Authority, PCT/US2009/045120, mailed Sep. 25, 2009, 6 pages.

Choban et al., Journal of Power Sources, 2004, vol. 128, Issue 1, pp. 54-60.

Kane et al., Biomaterials, 1999, vol. 20, Issues 23-24, pp. 2363-2376.

* cited by examiner

METHOD OF FORMING A PATTERNED SUBSTRATE

CROSS-REFERENCE TO RELATED APPLICATIONS

This application is a national stage filing under 35 U.S.C. 371 of PCT/US2009/045120, filed May 26, 2009, which claims priority to U.S. Provisional Application No. 61/076, 736, filed Jun. 30, 2008, and the disclosure of which is incorporated by reference in its entirety herein.

FIELD

The present disclosure relates to a method of forming a patterned substrate.

BACKGROUND

Polymeric films with conductive material patterns have a variety of commercial applications. In some applications, it is desirable to have a conductive grid being invisible or nearly invisible to the unaided eye and supported on a transparent polymeric substrate. Transparent conductive sheets have applications for resistively heated windows, electromagnetic interference (EMI) shielding layers, static dissipating components, antennas, touch screens for computer displays, and surface electrodes for electrochromic windows, photovoltaic devices, electroluminescent devices and liquid crystal displays.

Substrates having patterned features have been described. Patterning of micron scale features on substrates based on photolithographic techniques has resulted in inconsistent patterning and upper limitations on pattern size, particularly for flexible substrates. There is a need for selectively forming micron scale features on substrates in a consistent manner, particularly for large patterns with small feature sizes and particularly for flexible substrates, without the use of photolithography.

SUMMARY

The present disclosure provides methods for forming patterned substrates. More specifically, methods are provided for selectively patterning substrates by selectively placing liquids onto substrates.

In one aspect, a method of forming a patterned substrate is provided. The method includes (a) providing a substrate having a structured surface region comprising one or more recessed features; (b) disposing a first liquid onto at least a portion of the structured surface region; (c) contacting the first liquid with a second liquid; and (d) displacing the first liquid with the second liquid from at least a portion of the structured surface region. The first liquid is selectively located in at least a portion of the one or more recessed features.

In another aspect, a method of forming a patterned substrate is provided. The method includes (a) providing a substrate having a metallized structured surface region comprising a metal layer disposed on the structured surface region such that the metallized structured surface region comprises one or more recessed features and a surface region complementary to the one or more recessed features; (b) disposing a first liquid onto at least a portion of the metallized structured surface region; (c) contacting the first liquid with a second liquid; (d) displacing the first liquid with the second liquid from at least a portion of the metallized structured surface region such that the first liquid is selectively located in at least a portion of the one or more recessed features; and (e) dissolving at least a portion of the metal layer into the second liquid selectively from the surface region complimentary to the one or more recessed features.

DETAILED DESCRIPTION

Although the present disclosure is herein described in terms of specific embodiments, it will be readily apparent to those skilled in the art that various modifications, rearrangements, and substitutions can be made without departing from the spirit of the invention. The scope of the present invention is thus only limited by the claims appended herein.

The recitation of numerical ranges by endpoints includes all numbers subsumed within that range (for example, 1 to 5 includes 1, 1.5, 2, 2.75, 3, 3.8, 4, and 5).

As included in this specification and the appended claims, the singular forms "a", "an", and "the" include plural referents unless the content clearly dictates otherwise. Thus, for example, reference to a composition containing "a compound" includes a mixture of two or more compounds. As used in this specification and appended claims, the term "or" is generally employed in its sense including "and/or" unless the content clearly dictates otherwise.

Unless otherwise indicated, all numbers expressing quantities or ingredients, measurement of properties and so forth used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings of the present disclosure. At the very least, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains errors necessarily resulting from the standard deviations found in their respective testing measurements.

Substrates useful for forming patterned substrates of the present disclosure comprise a structured surface region having one or more recessed features. A first liquid is disposed onto at least a portion of the structured surface region. A second liquid contacts the first liquid. In one embodiment, a second liquid which is substantially immiscible with the first liquid can contact the first liquid. Upon contact, the second liquid displaces the first liquid from at least a portion of the structured surface region. The first liquid can be selectively located in at least a portion of the one or more recessed features. A combination of physical and chemical attributes can provide for the selective placement of one of the two liquids into a least a portion of the one or more recessed features. The term "placement" can refer to a location (for example, location of a first liquid) in the structured surface region of a substrate.

Figure 1:
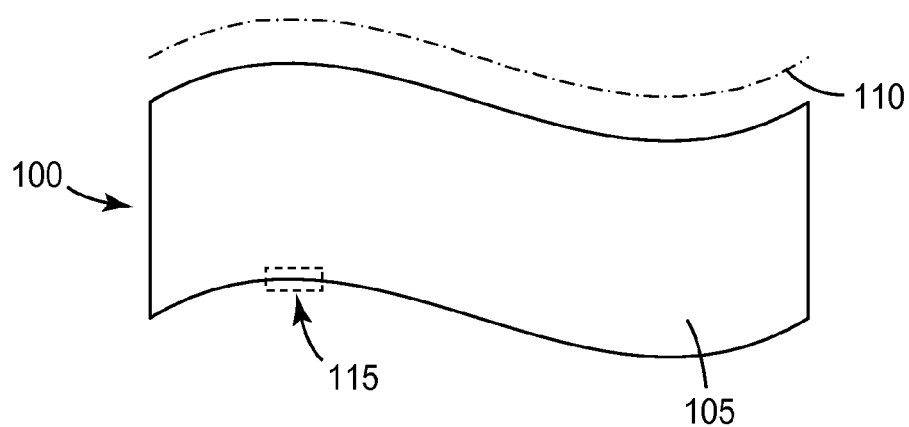
FIG. 1 is a schematic representation of a substrate having a structured surface region.

FIG. 1 illustrates a substrate 100 having a structured surface region 115. Substrate 100 comprises a major surface 105 having a major surface contour 110.

Substrates having a structured surface region can be, for example, a film, a sheet, a web, a belt, a roller, a drum, a ribbon, or other three dimensional shapes or structures, or the like. The substrate can be formed, for example, from a polymeric material, a metallic material, a ceramic material, or combinations thereof. The material selected for the substrate generally has properties suitable for a particular application. Some of these properties include physical, chemical, optical, electrical, and thermal. Suitable polymeric materials for substrates include, for example, thermoplastics such as polyacrylates, polymethacrylates, polycarbonates, polyesters, polyolefins, polyimides, and the like. Suitable metallic materials include, for example, indium, silver, gold, aluminum, titanium, copper, nickel, steel, lead, and the like. Suitable ceramic materials include, for example, oxides, nitrides, borides, carbides, and the like.

The structured surface region of the substrate can be generally described in terms of an average elevation. The average elevation of the structured surface region can be defined as an imaginary surface associated therewith i) lacking protrusive features or intrusive features, ii) being parallel to a structured surface region contour of the substrate in the structured surface region, and iii) residing at an elevation within the projected area of the structured surface region that is equal to the mean elevation calculable in terms of the points that define the nearby protrusive features and the intrusive features. The structured surface region contour of the substrate can be referred to as the shape of the surface of the substrate surface, regardless of the shape of the protrusive features and the intrusive features of the structured surface region. A structured surface region contour is that portion of the major surface contour associated with the structured surface region, the structured surface region being a portion of the major surface. For example, a generally flat film that includes a structured surface region contour which is a plane in the form of a flat sheet. In the present disclosure, the average elevation within the structured surface region of the substrate can be defined as the sum of the elevation of points within a region (for example, the elevation of any point being defined as its position along a coordinate orthogonal to the plane of the substrate) divided by the number of points.

Figure 2:
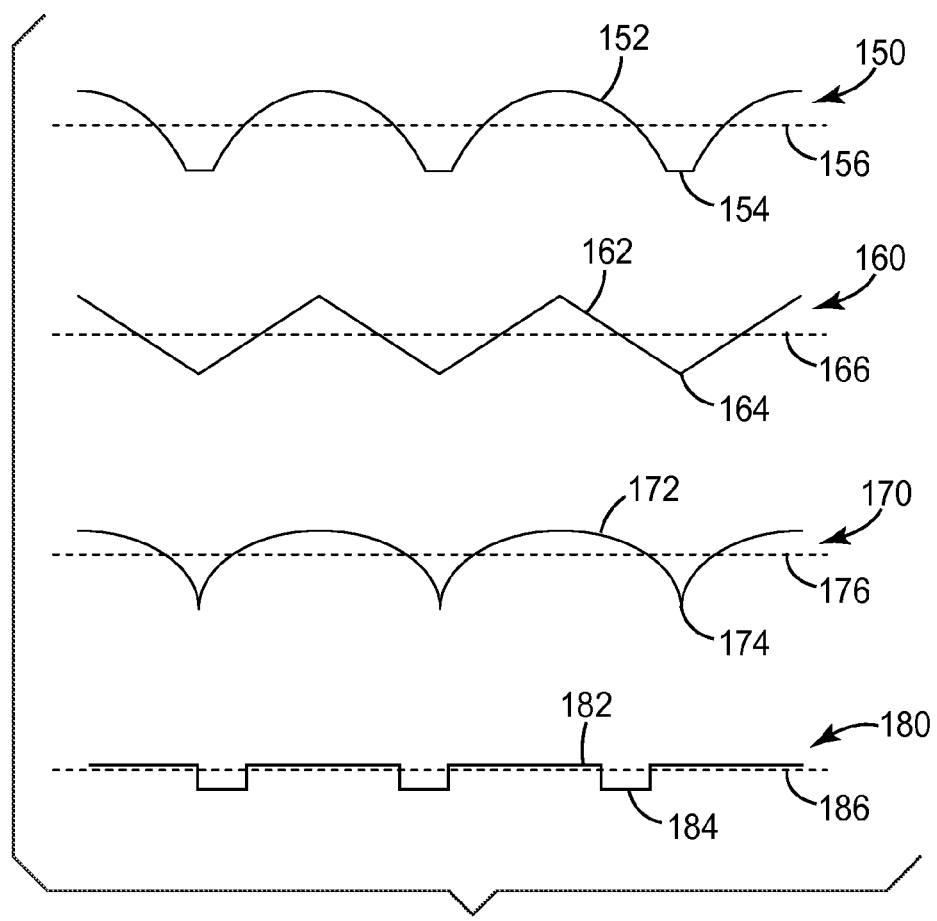
FIG. 2 is a schematic representation of structured surface regions.

FIG. 2 illustrates some representative examples of structured surface regions 150, 160, 170, 180 having protrusive features 152, 162, 172, 182 and intrusive features 154, 164, 174, 184. An average elevation 156, 166, 176, 186 lies between an elevation of points that lie on the protrusive features 152, 162, 172, 182 and the elevation for points that lie on adjacent intrusive features 154, 164, 174, 184.

Structured surface regions comprise protrusive features and intrusive features. Protrusive features of a structured surface region can generally be described as features having surface points that lie above the average elevation of the structured surface region. Intrusive features (for example, recessed features) of the structured surface region can generally be described as features having surface points that lie below the average elevation of the structured surface region. In some embodiments, an intersection of the average elevation with the surface of the structured surface region itself can be generally described as the boundary between the protrusive features and the intrusive features.

In some embodiments, a substrate comprising a structured surface region can have features that are relatively free of curvature (for example, flat feature). The features that are relatively free of curvature are referred to herein as flat. Some flat features can also be generally described as being parallel to the major surface contour of the substrate. The latter flat features are referred to herein as flat and parallel. In other embodiments, the flat feature can be skewed or generally nonparallel relative to the major surface contour. Some portions of flat features can generally have curvatures that are less than 100 m$^{-1}$, less than 1 m$^{-1}$, or even less than 0.1 m$^{-1}$.

In some embodiments, a structured surface region can comprise an extended area that is flat and parallel, in combination with protrusive features, such that the flat and parallel region can be referred to as a land area. By extended, what is meant is that flat and parallel land area or areas are present along the base edges of multiple protrusive features. In some embodiments, the extended and flat and parallel land area surrounds one or more protrusive features, as would be the case, for example, for a flat land area surrounding each of a hexagonal array of protrusive hemispheres of diameter (D) that are spaced by a dimension greater than (D). In some embodiments, the structured surface regions of a substrate can comprise an extended area being flat and parallel in combination with intrusive features or recessed features. In some embodiments, the structured surface regions can be generally lacking flat and parallel portions such that the surfaces have curvature or are skewed with respect to the major surface contour. In other embodiments, a combination of surfaces having curvature and being skewed with respect to the major surface contour can be structured surface regions generally lacking flat and parallel portions. In general, a protrusive feature having a portion or surface area being flat and parallel is described herein as a "plateau."

Substrates having a structured surface region generally comprise a combination of protrusive features and intrusive features. Some of these features can function to exclude, retain, or provide for a combination of excluding or retaining first liquids disposed onto a structured surface region. The surfaces of the protrusive or intrusive features can be smooth, partially smooth, textured, or a combination thereof. The features can be nano-replicated, micro-replicated, macro-replicated and the like. Some structured surface regions can comprise nano-replicated, micro-replicated, and macro-replicated features and patterns as similarly described in U.S. Pat. No. 6,649,249 (Engle et al.) and U.S. Pat. No. 7,105,809 (Wood et al.). In some embodiments, the structured surface region of the substrate can include regular or random features. These features can be spatially located throughout the structured surface region.

Structured surface regions having intrusive features can be referred to as having features. The term "intrusive features" is used interchangeably herein with recessed features or recesses. Recessed features, for example, can be referred to as recesses, wells, cavities, regions, pockets, channels, and the like. Recessed features having recessed surfaces provide a location within or on the structured surface region to retain a first liquid. Recessed features can have a volume with dimensions such as diameter, radius, height, width and length. The first liquid can be retained by walls and other features located on or within the structured surface region. A base (for example, lowest elevation) of the recessed feature can generally refer to a location within the recessed feature having points lying farthest from an average elevation. In some embodiments, a recessed feature can be positioned separately from another recessed feature by adjacent protrusive features.

In some embodiments, a structured surface region comprises intermediate recessed features (for example, recessed features having intermediate elevations). Intermediate recessed features can generally be described as intrusive features having points that lie below an average elevation, and having a lowest elevation that is higher than the lowest elevation of one or more other recessed features. For example, structured surface regions can provide a first recessed feature having a first lowest elevation and a second recessed featured having a second lowest elevation. The first lowest elevation can be distinguished from the second lowest elevation such that the first lowest elevation is higher than the second lowest elevation, making the first recessed feature an intermediate recessed feature. In such an instance, the second recessed feature can be at the same time an intermediate recessed feature.

Protrusive features of the structured surface region can influence the flow and delivery of a first liquid onto a substrate. In some embodiments, protrusive features separate recessed features, and can guide or provide direction for the movement of the first liquid into the recessed features. In some embodiments, the structured surface region can influence the flow of the first liquid and subsequent collection of the first liquid into the recessed features. Some examples of protrusive features positioned on or within the structured surface region include, for example, peaks, nodules, posts, lumps, ridges, and the like, or combinations thereof. Examples of ridges include raised linear features with rounded tops, for example, as would be defined by arraying half-cylinders, rectangular flat face down, on a flat surface. Some other examples of ridges include raised linear features with a pointed apex and two facets, as would be defined by arraying triangular prisms, flat face down, on a flat surface, the flat face being one of the faces that is parallel to the axis of the prism.

Structured surface regions having one or more protrusive features that are of essentially one elevation, flat, and parallel to the major surface contour and one or more intrusive features (or recessed features) that are of another elevation, flat, and parallel to the major surface contour can be referred to as bilevel structured surface regions. In general, it can be very challenging using other known methods to localize a liquid deposit into the recessed features of bilevel structured surface regions, in particular when such regions are characterized by a low area density of small recessed features. In contrast, the method of the present disclosure, which comprises contacting a first liquid that has been deposited onto such a structured surface region with a second liquid, has been found to be very effective for aiding in such localization of the first liquid. In one embodiment, the second liquid is substantially immiscible with the first liquid. In another embodiment, the second liquid is partially miscible with the first liquid. The approach involving two liquids is particularly useful for placing the first of the liquids into the recessed features of a structured surface region when the area density of recessed features is less than, for example, 25 percent, even less than 15 percent, even less than 5 percent, and even less than 1 percent, regardless of whether the structured surface region is a bilevel surface. However, the approach involving two liquids, preferable two substantially immiscible liquids, is particularly useful for placing the first of the liquids into the recessed features of a bilevel structured surface region when the area density of recessed features is less than, for example, 25 percent, even less than 15 percent, even less than 5 percent, and even less than 1 percent. Bilevel surface can be useful for controlling the placement and retention of a first liquid when contacted with a second liquid. Bilevel surfaces can comprise recesses and flat protrusive regions such that the first liquid can be retained within the recesses. Not wishing to be bound by theory, the retension of the first liquid within the recesses is believed to be brought about in part by capillary forces.

Structured surface regions have been described. Some suitable examples of structured surface regions having a combination of protrusive features and intrusive features comprise linear prisms, pyramids, semi-ellipsoids, cones, nonlinear prisms, bilevel structures, and the like, or combinations thereof. In some embodiments, linear prisms can include, for example, triangular prisms, pentagonal prisms, square prisms, and the like, or combinations thereof. In some embodiments, pyramids can include, for example, square pyramids, pentagonal pyramids, hexagonal pyramids, and the like, or combinations thereof. The description of a surface as comprising linear prisms means that the surface topography is that which would result from the fusion of linear prisms to a flat surface, the contact surface of each linear prism to the flat surface being a face that is parallel to the axis of the prism. The description of a surface as comprising a pyramid means that the surface topography is that which would result from the fusion of a pyramid to a flat surface, the contact surface of the pyramid being a face of the pyramid.

In some embodiments, the geometry of the structured surface region can be hierarchical. For example, within the structured surface region, recessed features can have random, partially random, or precisely spaced features positioned on the surfaces or walls of the recessed features, on raised regions of the recessed features, and within the recessed features. The surfaces of the recessed features can include protrusive features on a shorter length scale than that characteristic of the recessed feature itself, for example. In some contexts herein, protrusive features and intrusive features are features commonly referred to as topographical features.

Protrusive features that are not plateaus can vary in the curvature or sharpness at the apex. The sharpness can range up to one extreme that is describable as the result of the protrusive feature being defined by two or more facets that converge at the apex, for example at an angle less than 120 degrees, even less than 90 degrees, even less than 45 degrees, or even less than 20 degrees. The sharpness can range down to another extreme where the protrusion has the shape at its apex of a cylinder, sphere, or ellipsoid with curvature of, for example, approximately $150^{m-1}$ (radius of curvature of approximately 6.7 mm). The sharpness of the apex of a protrusive feature that is not a plateau may exist between the aforementioned extremes.

In some embodiments, the recessed features of the structured surface region can be located separately from each other with protrusive features. The combination of protrusive features and intrusive features can promote and direct the dewetting of the first liquid during coating or when contacted with a second liquid.

Some of the features of the structured surface region can be formed or positioned on a nano-scale, micro-scale, macro-scale, and the like. Similarly, features can be provided on the surfaces of the protrusive features, the intrusive features, and the like, or combinations thereof. Generally, the structured surface region includes features such that at least two dimensions of the features are microscopic. Microscopic features are sufficiently small so as to require an optic aid to the naked eye to determine their shape. In some embodiments, the dimensions of the topographical features can range up to about one centimeter or less in at least one of the three possible dimensions (in/out of the plane of the structured surface region, and in each direction along the plane of the structured surface region). In other embodiments, the dimensions of the topographical features can range up to about 1 millimeter in at least one of the three possible dimensions. In other embodiments, the dimensions of the topographical features can range up to about 500 micrometers in at least one of the three possible dimensions. In yet other embodiments, the dimensions of the topographical features can range up to about 250 micrometers in at least one of the three possible dimensions.

In some embodiments, it is preferred that one or more dimensions of a topographical feature, as part of a structured surface region, be less than a desired magnitude. For example, in some embodiments, it is preferred that the width of a recessed feature in the form of a channel is less than 100 micrometers, less than 50 micrometers, less than 25 micrometers, less than 10 micrometers, or even less than 5 micrometers.

The topographical features may have a desired characteristic length (such as length measured along a given direction) and a desired featured density (features per unit projected area of the structured surface region). In some embodiments, a feature can be such that its dimensions in three orthogonal directions (for example, normal to the plane of the major surface contour of the structured surface region, and in each of two orthogonal directions along the major surface contour of the structured surface regions) are equal, and thus all equal to its characteristic length. In some embodiments, a feature can be such that the characteristic length in one or more directions is somewhat longer, or even much longer, than its dimensions in the other direction or directions. In some embodiments, a feature can be such that the characteristic length in one or more directions is somewhat shorter, or even much shorter, than its dimensions in the other direction or directions. Examples of characteristic lengths for topographical features include the length of a channel, the width of a channel, the width of a hemispherical protrusion, the length of a ridge, the width of a ridge, the height of a pyramidal protrusive feature, and the height of a hemispherical protrusive feature.

In some embodiments, topographical features of the structured surface region have a characteristic length in one or more directions of 500 micrometers or less. In other embodiments, the characteristic length is 100 micrometers or less, and in other embodiments, the characteristic length in one or more directions is 10 micrometers or less. In some embodiments, the characteristic length in one or more directions is at least 1 nanometer. In other embodiments, the characteristic length in one or more directions is at least 10 nanometers, and in another embodiment, the characteristic length is at least 100 nanometers. In some embodiments, the characteristic length in one or more directions of the one or more topographical features of the structured surface region lies in a range of about 500 micrometers to about 1 nanometer, in other embodiments in a range of about 100 micrometers to about 10 nanometers, and in yet other embodiments in a range of about 10 micrometers to about 100 nanometers. Different embodiments result from the combination of the aforementioned values and ranges of values with the aforementioned characteristic length and shape descriptions (for example, widths, lengths, and heights of ridges, channels, hemispheres, and pyramids).

In some embodiments, the topographical feature density of the structured surface region can be at least in a range of 10 features or greater per square millimeter ($mm^2$). In some embodiments, the structured surface region can have a topographical feature density of greater than 100 features or greater per $mm^2$, in other embodiments, a topographical feature density of greater than 1,000 features or greater per $mm^2$, and in other embodiments a topographical feature density of greater than 10,000 features per $mm^2$. As an example of topographical feature density, a structured surface region having a square array of 100 micrometer hemispherical protrusive features spaced in both repeat directions at 115 micrometers has a protrusive feature density of approximately 75 protrusive features per $mm^2$. For the same geometry, the density of narrow recessed channels between adjacent hemispheres is approximately 150 per $mm^2$.

In some embodiments, the topographical features are distributed as an array across a structured surface region (for example, a one-dimensional array or a two-dimensional array, for example a square array or a hexagonal array). In some of such embodiments, it is preferred that the uniformity (for example, reproducibility) of the dimensions of topographical features of the structured surface region be high. As a measure of uniformity, the standard deviation of the length of a particular dimension of the repeating features is preferably less than 25 percent of the average magnitude of that length, more preferably less than 10 percent, even more preferably less than 5 percent. In some such embodiments, it is preferred that the uniformity of the density of topographical features of the structured surface region be high. As a measure of high uniformity for the density of topographical features in a structured surface region, the standard deviation of the density of topographical features, measured for sub-regions having no larger than 1/10th the projected area of the structured surface region itself, is preferably less than 25 percent, more preferably less than 10 percent, most preferably less than 5 percent.

In some embodiments the topographical features in a structured surface region are not distributed in a regular array, and may be non-repeating and non-uniform. On a single structured surface region, the included topographical features can have non-uniform dimensions and variable shapes. In some of such embodiments, it is not necessary that the uniformity of the dimensions of topographical features of the structured surface region be high. In some of such embodiments, it is preferred that the dimensions of topographical features of the structured surface region are varied in depth, width, shape and direction. For example, the structured surface region can include recessed features that are in the form of linear channels together with one or more recessed features that has an equiaxed shape in its projection on the major surface contour of the structured surface region, for example a circular recess. The aforementioned combination of shapes for recesses in the same structured surface region can characterize a bilevel structured surface region. As another example, a recessed feature in the form of a channel need not be straight, but rather can trace an arbitrary path along the structured surface region. Further elaborating on the latter, the recessed feature can be a channel of approximately square cross-section that traces a path in the along the major surface of the structured surface region that is serpentine, sinusoidal, spiral, or saw tooth in shape for example. The aforementioned description of channel paths along the major surface contour of a structured surface region can characterize a bilevel structured surface region.

In some embodiments, the recessed features compose a network of channels that span the structured surface region, for example a square grid of recessed channels that partially cover the projected area of the structured surface region at an area fraction of, for example, less than 25 percent, less than 10 percent, or even less than 5 percent. Another example of a shape of a recessed channel network is the channel pattern that is complementary to a hexagonal array of protrusive hexagons in the case of a bilevel structured surface region. For such a hexagonal channel network, the recessed channels can, for example, cover the projected area of the structured surface region at an area fraction of less than 25 percent, less than 10 percent, or even less than 5 percent.

In some embodiments, features of the structured substrate region can be present on a regular repeating basis, on a random basis, and the like, or combinations thereof. In other embodiments, the features can be present over a portion of the entire area of the structured surface region, or present over the entire area of the structured surface region. In some embodiments, features can be present in the recessed features of the structured surface region, present on the protrusive features of the structured surface region, and the like, or combinations thereof.

In some embodiments, the structured surface region comprises one or more intrusive features (for example, recessed features), such that the intrusive features and the protrusive features are generally uniform. In some embodiment, the intrusive features and the protrusive features of the structured surface region are non-uniform. For example, the structured surface region can have intrusive features and protrusive features having different dimensions across a portion of the structured surface region. In some embodiments, a first set of intrusive features and protrusive features can have a first set of dimensions, and a second set of intrusive features and protrusive features can have a second set of dimensions. The first set of intrusive features and protrusive features and the second set of intrusive features and protrusive regions can be uniformly distributed or randomly distributed across the structured surface region of the substrate. In some embodiments, the first liquid can reside in a portion of the recessed feature having dimensions suitable for retaining the first liquid.

In one embodiment, the substrate having a structured surface region can be a brightness enhancement film (BEF) as described in U.S. patent application Ser. No. 11/283,307 (Richard et al.). In another embodiment, the substrate having a structured surface region can be a polymer film having a surface comprising pyramids as described in U.S. patent application Ser. No. 11/193,052 (US20070024994). In another embodiment, the substrate having a structured surface region can be a microlens film under the trade designation MICRO OPTICS MICROLENS ARRAY commercially available from Leister Process Technologies, Axetris Microsystems Division of Riedstrasse, Switzerland. Microlens arrays have been described in U.S. Pat. No. 5,300,263 (Hoopman et al.), U.S. Pat. No. 5,439,621 (Hoopman), and U.S. Patent Application Publication No. 2006/0072199 (Morishita et al.). In one embodiment, the substrate comprises a microreplicated substrate.

The substrate having a structured surface region can be selected with features that promote or provide for a first liquid to flow and be retained in the recessed features. As a first liquid is displaced from at least a portion of the structured surface region by contacting a second liquid, preferably a substantially immiscible second liquid, the first liquid can be located in at least one or more of the recessed features. As the first liquid is displaced by the second liquid, the first liquid is removed from a portion of the features of the structured surface region. The first liquid can reside in the recessed features resulting from the capillary forces of the recessed features. The removal of the first liquid from the protrusive features when contacted by a second liquid can be manipulated, for example, by adjusting the rheology (for example viscosity) and surface tension of the first liquid and the surface energy of the substrate.

In the method of the present disclosure, a first liquid is disposed onto at least a portion of a structured surface region of a substrate. The first liquid can be a material having sufficient viscosity to flow onto the structured surface region. The first liquid can be suitable for chemical or physical modification of a structured surface region. In some embodiments, the first liquid can be chemically or physically modified. In some embodiments, the first liquid can be neat (for example, pure, or undiluted). The first liquid can be a flowable material. The rheology and the viscosity of the first liquid provide for i) disposing the first liquid onto the structured surface region, and ii) displacing the first liquid with a second liquid from at least a portion of the structured surface region. The first liquid can be thus located in at least one or more of the recessed features of the structured surface regions.

In some embodiments, the first liquid of the present disclosure comprises, for example, natural oil, a hydrocarbon containing material, a metal, a metal precursor, a first electroless plating catalyst, an electroless plating catalyst precursor, a mask material, a biological material, or combinations thereof. Some suitable natural oils include, for example, castor oil, soybean oil, peanut oil, canola oil, and the like, or combinations thereof. Hydrocarbon containing materials can include, for example, aromatic hydrocarbon containing materials, aliphatic hydrocarbon containing materials, and the like, or combinations thereof. Hydrocarbon containing materials can comprise elements including, for example, carbon, hydrogen, oxygen, sulfur, nitrogen, phosphorous, fluoride, chloride, bromide, and the like, or combinations thereof. Some hydrocarbon containing materials can comprise functional groups including, for example, esters, ethers, acids, salts, olefins, acetates, amides, amines, ketones, alcohols, and the like, or combinations thereof. In some embodiments, the hydrocarbon containing materials can include $C_4$-$C_{32}$ without functional groups. In other embodiments, the hydrocarbon containing materials can include $C_4$-$C_{32}$ having one or more of the above described functional groups. Some suitable hydrocarbon containing materials include, for example, hexanes, octane, dodecane, tetradecane, hexadecane, acetone, 1,2-propanediol, 1,2-butanediol, 1,5-pentanediol, 1,3-propanediol, 2,3-butanedione, and the like, or combinations thereof. Some suitable examples of other first liquids are described below.

The first liquid generally has a viscosity sufficient for the first liquid to flow into the recessed features of the structured surface region. In a preferred embodiment, the first liquid is substantially immiscible with the second liquid such that after contacting the second liquid, the first liquid can be displaced, for example as droplets, from at least a portion of the substrate. In some embodiments the first liquid is substantially miscible with the second liquid, but during contact between the first and second liquids the first liquid is retained within the recesses of the structured substrate and displaced from regions of the structured substrate that are complementary to the recesses. In some embodiments, the first liquid can have a viscosity generally similar to the second liquid. In other embodiments, the viscosity of the first liquid and the second liquid can be different. The viscosity of some first liquids can the result of, for example, the molecular weight, the average number of functional groups (for example, hydroxyl groups), and the like or combinations thereof.

In some embodiments, the first liquid can be a neat material. The term "neat" generally refers to a material being 100 percent pure, or nearly 100 percent pure. The neat material can be generally free of added material. In other embodiments, the first liquid can be comprised of two or more materials to form a mixture. In the mixture, the two or more materials can be miscible for forming a single phase. In the mixture comprising two or more materials, for example, a first material can be unreactive with a second material of the mixture. In some embodiments, the first material can be reactive with the second material. Some suitable materials of a mixture can include, for example, a solvent, a mixture of solvents or other flowable materials suitable for dissolving, dispersing, or suspending material of the first liquid. The first liquid in combination with a material can be a flowable material. The rheology and the viscosity of the first liquid comprising a mixture of two or more materials are generally sufficient for disposing the first liquid onto the structured surface region.

The first liquid of the present disclosure can be selected based on a number of factors. Some factors include, for example, the surface tension of the first liquid, the desired thickness of the first liquid in the recessed features of the structured surface region, the dimensions of the recessed features, the surface energy of the structured surface region of the substrate, and the like, or combinations thereof.

In some embodiments, a first liquid can be selected such that the surface tension of the first liquid and the surface energy of the structured surface region of the substrate are such that the first liquid can be disposed onto the structured surface region of the substrate. This can result in low contact angles and strong wetting of the first liquid onto the structured surface region of the substrate. As a result, the first liquid will tend to flow from at least a portion of the structured surface region when contacted with a second liquid, such that the first liquid can be selectively located in at least a portion of the recessed features. In some embodiments, a first liquid can be selected such that the surface tension of the first liquid and the surface energy of the structured surface region of the substrate are such that the first liquid can be disposed onto the structured surface region of the substrate resulting in moderate or even high contact angles and reduced wetting of the first liquid onto the structured surface region of the substrate. As a result, the first liquid will tend to flow from at least a portion of the structured surface region when contacted with a second liquid, such that the first liquid can be selectively placed in at least a portion of the recessed features.

In the method of the present disclosure, the first liquid is disposed onto the structured surface region of the substrate. Suitable techniques for disposing (for example, applying or coating) include, for example, saturation or immersion techniques, spray coating, curtain coating, slide coating, flood coating, die coating, roll coating, deposition, or by other known coating or application methods. Techniques can be chosen which dispose the first liquid uniformly or non-uniformly onto a portion of the structured surface region.

In some embodiments, the first liquid being disposed onto the structured surface region fills the recessed features and floods the remainder (that is protrusive features) of the structured surface region of the substrate. The first liquid can be disposed onto the structured surface region such that substantially all of the protrusive features and the intrusive features are coated with the first liquid.

In some embodiments, the first liquid being disposed onto the structured surface region fills a portion of the recessed features. The first liquid can be disposed onto the structured surface region by a disposal method such that some of the recessed features are coated or contacted with the first liquid, and some of the recessed features comprise some or no first liquid. In some instances, the structured surface region can comprise protrusive features and intrusive features having varying dimensions extending over a defined area. For example, a portion of the recessed features can have dimensions suitable for retaining the first liquid, and a portion of the recessed features can have dimensions such that the first liquid can not be retained within the recessed features.

In some embodiments, the first liquid being disposed onto the structured surface region can contact or occupy a portion of the volume of the one or more recesses features. The first liquid can be disposed onto the structured surface region such that the first liquid occupies a percentage of the volume of the one or more recessed features. In some embodiments, at least about 5 percent of the volume of the one or more recessed features can be occupied by the first liquid. In another embodiment, at least about 10 percent, at least about 20 percent, at least about 30 percent, at least about 50 percent, at least about 70 percent, or at least about 90 percent of the volume of the one or more recessed features can be occupied by the first liquid. In some embodiments, the first liquid can occupy different volumes of the one or more recessed features.

In another embodiment, the first liquid occupies a portion of the recessed features such that an air gap exists between at least a portion of the recessed features and the first liquid disposed within the recessed features.

The topographical features, including the recessed features and protrusive features, of the structured surface region can have dissimilar dimensions capable of receiving substantially all or receiving a portion of the first liquid.

Figure 3A:
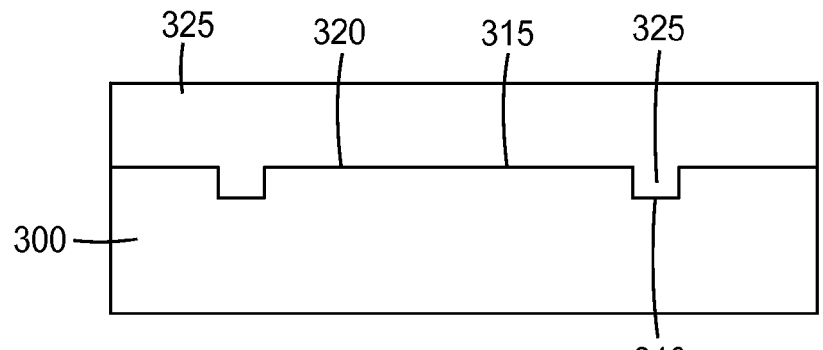
FIG. 3A is a schematic representation of a first liquid contacting at least a portion of the structured surface region of the substrate comprising one or more features.

FIG. 3A illustrates a portion of a substrate in cross-section comprising a structured surface region 300 having recessed features 310 and protrusive features 315. A first liquid 325 is disposed on the structured surface region 300 forming a first interface 320.

Figure 3B:
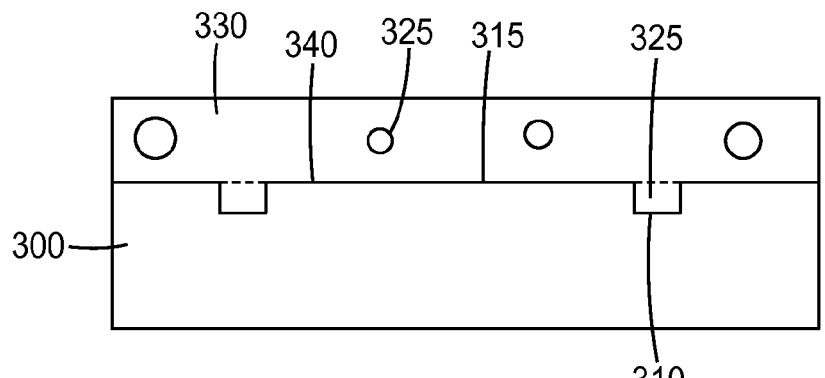
FIG. 3B is a schematic representation of contacting and displacing a first liquid with a second liquid.

FIG. 3B illustrates a portion of a substrate in cross-section comprising a structured surface region 300 and a first liquid 325 disposed thereon. The first liquid 325 is contacted with a second liquid 330 forming a second interface 340. The first liquid 325 is displaced from the protrusive features 315. The first liquid 325 is selectively located in the recessed features 310 of the structured surface region 300 of the substrate.

In the method of the present disclosure, a second liquid is selected to displace the first liquid from at least a portion of the structured surface region. In one embodiment, the second liquid is substantially immiscible with the first liquid. The term "substantially immiscible" refers to, for example, a first liquid that can be largely incapable of being soluble with the second liquid such that the liquids can form two separate phases.

The second liquid can contact the first liquid and not be miscible with the first liquid. Some suitable second liquids include, for example, water, methanol, ethanol, propanol, and the like, or combinations thereof. Generally, substantially immiscible liquids such as the first liquid and the second liquid form two separate phases. A related publication on miscible liquids can be found at: 1) Solvent Miscibility/Immiscibility Tables (2008 Sigma-Aldrich; St. Louis, Mo.) and 2) CRC Handbook, $64^{th}$ Ed. 1983-1984, C699-C701, CRC Press, Incorporated.

The miscibility or the immiscibility of liquids can be partly a function of entropy. Sometimes, liquids mix readily, for example, to form a miscible solution. Generally, the forces of attraction between the molecules of different liquids can contribute to miscibility including, for example, such factors as molecular structure and polarity. The molecular structure of the liquid, and the attachment of the atoms to one another (linear, branched, dendritic, and others) can affect the miscibility of liquids. The polarity of the liquid can be related to the presence of hydrophilic (for example, hydroxyl, amine, acid) or hydrophobic (for example, alkyl) groups. The free energy change of mixing for liquids can be heavily influenced by the change in enthalpy of the mixing liquids, the absolute temperature, and the change in entropy of mixing liquids at the absolute temperature. A negative value of the free energy change on mixing indicates a driving force toward mixing of two liquids. Otherwise, two separate phases can be predicted. Sometimes two miscible liquids in contact with one another do not mix substantially, as is observed during multistream laminar flow inside microreactors, wherein two different aqueous streams introduced into the same channel will proceed to flow laminarly in parallel as the viscous effects dominate over the inertial effects. Publications related to this phenomenon include 1) Journal of Power Sources, Volume 128, Issue 1, Pages 54-60 and 2) Biomaterials, Volume 20, Issues 23-24, Pages 2363-2376. Accordingly, in some embodiments, a second liquid that is at least partially miscible with the first liquid can be used to displace the first liquid from a portion of a structured surface region, for example, the protrusive features, leaving the first liquid selectively in the recessed features.

Two separate phases indicative of substantially immiscible liquids, for example, can result from a positive enthalpy of mixing between the liquids. An imbalance or mismatch of factors as described above can contribute to immiscibility between liquids. For example, hexane can be considered substantially immiscible with water. Hexane does not have a similar structure or hydroxyl groups available for hydrogen bonding as with water. The lack of attraction between hexane and water can render these solvents substantially immiscible rendering the formation of two separate phases. It is understood by those in the art that, regarding two liquids that are substantially immiscible, a very small amount of one may dissolve in the other. In doing so, the relationship of immiscibility is not eliminated. Entropic contributions to the free energy are understood to make complete and perfect immiscibility unrealistic. In the methods disclosed here, immiscibility refers to a general level of immiscibility as would be understood to characterize commonly encountered substantially immiscible mixtures such as a mixture of vegetable oil and water. Additional factors can contribute to the localization of a first liquid in a recessed portion of a structured substrate, and the retention of that first liquid when brought into contact with a second liquid with which the first liquid is miscible. Such factors include, but are not limited to, the capillary forces provided by the three dimensional shapes of the recessed features on the structured surface region of the substrate, the surface energy of the solid substrate and the surface tension of the liquid, and the degree to which the structured surface region of the substrate contacted by the first liquid is agitated in the second liquid.

The second liquid of the present disclosure can be a flowable material. In some embodiments, the second liquid can be water and the first liquid can be tetradecane. The second liquid can comprise, for example, another material or a solvent, another molecule or reactant, or another molecule or reactant dispersed or suspended in the second liquid, and the like. In one embodiment, the second liquid comprises a reactant to remove or dissolve or react with at least a portion of the structured surface region of the substrate.

In one embodiment, the second liquid comprises an etchant. The second liquid can comprise an aqueous solvent and an etchant. The aqueous solvent combined with the etchant can be useful for removing metal layers such as those known in subtractive processed. One useful subtractive processes for removing metal layers can include, for example, wet chemical etching. Wet chemical etchants are described below.

Some techniques for contacting the first liquid with the second liquid include, for example, saturation or immersion techniques, spray coating, curtain coating, slide coating, flood coating, die coating, roll coating, deposition, knife coating, or by other known coating or application methods.

In the method of the present disclosure, the first liquid is disposed on at least a portion of the structured surface region. The first liquid can be displaced from a portion of the structured surface region of the substrate when contacted with a second liquid. In some embodiments, immiscibility of the first liquid with the second liquid can provide for the existence of two phases. Immiscibility of the second liquid with the first liquid can direct or flow the first liquid from some features of the structured surface region while retaining at least a portion of the first liquid in some other features of the structured surface region of the substrate.

The first liquid can be displaced from a portion of the structured surface region upon contact with a second liquid. In some embodiments, the structured surface region of the substrate coated with the first liquid can be immersed in a bath containing the second liquid. Upon contact with the second liquid, the first liquid and the second liquid can form two phases, for example, localized in the region of contact of the first liquid and the second liquid. During contact of the first liquid with the second liquid, the first liquid can be displaced or removed from at least a portion of the structured surface region. Upon such removal, the first liquid can be located or be retained in the recessed features. In some embodiments, the first liquid can be displaced from the protrusive features of the structured surface region. The capillary forces of the recessed features of the structured surface region can provide for retention of the first liquid in the presence of the second liquid. In the present disclosure, a combination of i) the immiscibility of the first liquid with the second liquid, and ii) the capillary forces of the recessed features of the structured surface region can provide for selective placement of the first liquid in the recessed features of the structured surface region.

Figure 3C:
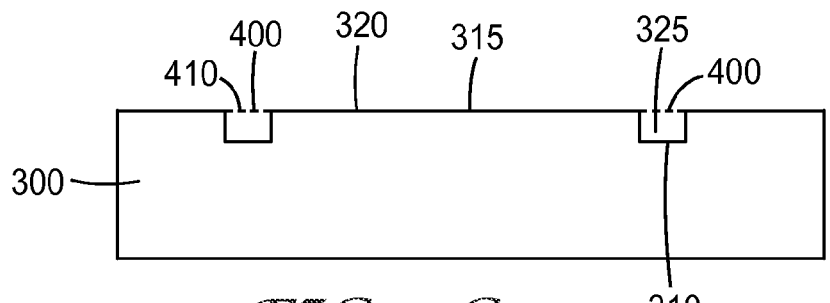
FIG. 3C is a schematic representation of a first liquid selectively located in the recessed features.

FIG. 3C illustrates a structured surface region 300 of a substrate having the second liquid 330 (not shown) removed from the protrusive features 315. The first liquid 325 resides in the recessed features 310. A meniscus 400 is formed at the air-first liquid interface 410 of the first liquid 325.

In some embodiments, the surface of the first liquid located in the one or more recessed features can be concave or convex. The shape of the surface of the first liquid can be in response to the surface of the features of the structured surface region of the substrate. In general, a convex meniscus can occur when the molecules of the first liquid have a stronger attraction to each other than to the surface of the structured surface region. For example, a convex meniscus can be observed between mercury and glass of a barometer. A concave meniscus can occur when the molecules of the first liquid have a stronger attraction for the surface of the structured surface region. For example, a concave meniscus can be observed between water and glass of a container. Capillary action acts on the concave meniscus to pull the molecules of the first liquid up. Capillary action acts on the convex meniscus to pull the molecules of the first liquid down.

Figure 4:
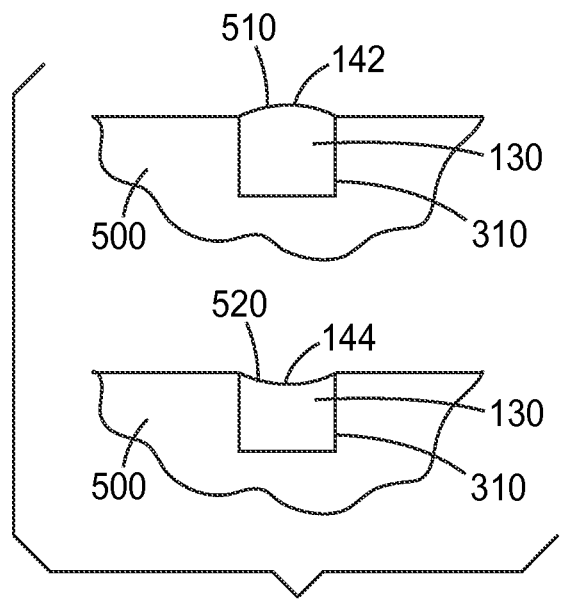
FIG. 4 is a schematic representation of a first liquid in a recessed feature.

FIG. 4 illustrates a recessed feature 310 of a structured surface region 500. A first liquid 130 is disposed in the recessed feature 310. A convex meniscus 142 on the surface of the first liquid 130 is formed at a first air-liquid interface 510. A concave meniscus 144 on the surface of the first liquid 130 is formed at a second air-liquid interface 520.

In some embodiments, the first liquid can convert to a solid after the first liquid is selectively located in at least a portion of the one or more recessed features of the structured surface region. The first liquid can become a solid, for example, due to cooling, loss of a material (for example, evaporation), crystallization, and the like, or combination thereof.

In other embodiments, the first liquid selectively located in the recessed features of the structured surface region can be a mask (for example, solid or liquid) for a subtractive metal removal process.

In some embodiments, a structured surface region with a first liquid located within the recessed features can be backfilled with an adhesive or refractive index matching material. "Backfilling" generally refers to filling of the recessed features with a material, and optionally overcoating adjacent protrusive features with the backfilling material.

Figure 5:
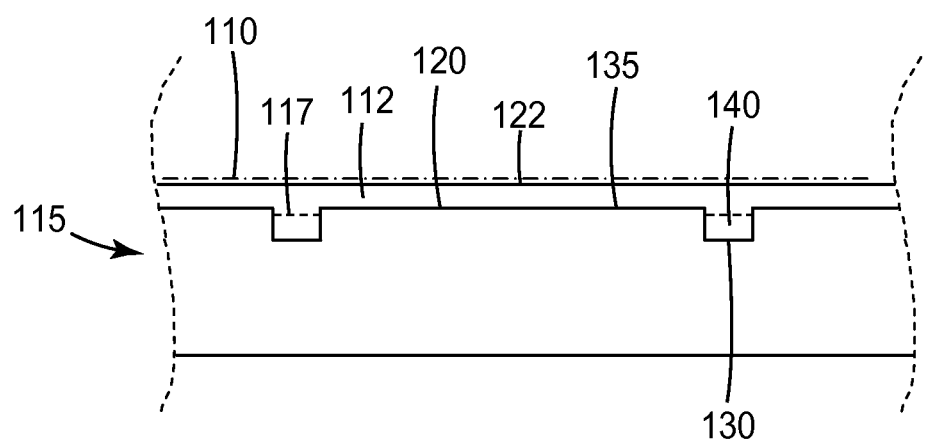
FIG. 5 is a schematic representation of a patterned substrate having at least partially filled recesses.

FIG. 5 illustrates a structured surface region 115 having a major surface contour 110. The structured surface region 115 includes recessed features 130 and protrusive features 135. A first liquid 140 resides in the recessed features 130. A backfilling material 112 resides on the structured surface region 115. A first liquid-backfilling material interface 117 is formed where the backfilling material 112 contacts the first liquid 140. A protrusive feature-backfilling interface 120 is formed where the backfilling material 112 contacts the protrusive feature 135. The back filling material 112 includes a first surface 122 that is parallel with the major surface contour 110.

Backfilling can comprise filling the volume of the recessed features unoccupied by the first liquid, or a solid material derived from the first liquid. In other embodiments, the backfilling comprises filling a portion of the recessed features, and in further embodiments, the backfilling comprises overfilling the recessed features and the protrusive regions (for example, peaks) of the structured surface region. There can be several reasons to backfill the structured surface region after placement of the first liquid in the recessed features. In the case of a transparent substrate, it may be desirable to avoid the effects of refraction or reflection as light passes through the structured surface region of the substrate. This can be achieved by backfilling the structured surface region with material having the same or similar index of refraction (that is, index-matched) as the substrate. Optionally, the backfilling material can be the same as the material of the substrate that defines the structured surface region. Alternatively, it may be useful to backfill the structured surface region in order to protect the first liquid, for example from environmental degradation. Finally, it may be desirable to backfill the structured surface region in order to make the surface of a final article comprising the substrate with the structured surface region smooth.

The adhesive or refractive index matching material useful for backfilling can be applied to the structured surface region comprising a conductive ink, a conductive ink having a polymeric material, or a conductive ink having a cured polymeric material. The adhesive or refractive index matching material generally has the same or substantially the same refractive index to that of the substrate so there can be little or no reflection, or refraction of light passing through the substrate having a structured surface region. In some embodiments, the substrate having backfilled recessed features can be transparent. Suitable materials such as adhesives or refractive index matching materials can include thermoplastic and thermosetting polymers that are transparent over the desired range of light wavelengths.

The difference between the refractive index of the substrate and the adhesive or refractive index matching material can be up to 0.2, up to 0.1, up to 0.05, or up to 0.01. The difference between the refractive index of the substrate and the adhesive or refractive index matching material preferably can be as low as 0.005, more preferably as low as 0.001, more preferably as low as 0.0005, and even more preferably as low as 0.0001. In some embodiments, the difference between the refractive index of the substrate and the refractive index of the adhesive or refractive index matching material can be in a range of 0.0001 to 0.2, 0.0005 to 0.1, 0.001 to 0.05, or in a range of 0.005 to 0.01.

These backfilling materials can be amorphous, crystalline, or semi-crystalline, and can include, for example, homopolymer, copolymer or blends thereof. Suitable materials include, but are not limited to, poly(carbonate) (PC); syndiotactic (not used in optically isotropic form) and isotactic poly(styrene) (PS); C1-C8 alkyl styrenes; alkyl, aromatic, and aliphatic ring-containing (meth)acrylates, including poly(methylmethacrylate) (PMMA) and PMMA copolymers; ethoxylated and propoxylated (meth)acrylates; multifunctional (meth)acrylates; acrylated epoxies; epoxies; and other ethylenically unsaturated materials; cyclic olefins and cyclic olefinic copolymers; acrylonitrile butadiene styrene (ABS); styrene acrylonitrile copolymers (SAN); epoxies; poly (vinylcyclohexane); PMMA/poly(vinylfluoride) blends; poly (phenylene oxide) alloys; styrenic block copolymers; polyimide; polysulfone; poly(vinyl chloride); poly(dimethyl siloxane) (PDMS); polyurethanes; saturated polyesters; poly (ethylene), including low birefringence polyethylene; poly (propylene) (PP); poly(alkane terephthalates), such as poly (ethylene terephthalate) (PET); poly(alkane napthalates), such as poly(ethylene naphthalate)(PEN); polyamide; ionomers; vinyl acetate/polyethylene copolymers; cellulose acetate; cellulose acetate butyrate; fluoropolymers; poly(styrene)-poly(ethylene) copolymers; PET and PEN copolymers, including polyolefinic PET and PEN; and poly(carbonate)/aliphatic PET blends. The term (meth)acrylate can be defined as being either the corresponding methacrylate or acrylate compounds.

In some embodiments of the method of the present disclosure, the first liquid can be a metal, a metal precursor or a conductive polymer. The metal or metal precursor can be useful for forming conductive microstructures on a structured surface region of a substrate. Some suitable examples of metals include, for example, silver, nickel, platinum, gold, palladium, copper, indium, tin, aluminum, zinc, iron, tungsten, molybdenum, ruthenium, lead bismuth, and similar metals. Some suitable metals precursors useful include, for example, carboxylates, alkoxides or combinations of the metals described above. The metal precursors can be converted to a metal, metal oxide, or mixed metal oxide during processing eliminating ligands.

In one embodiment, the first liquid comprises a conductive ink. The conductive ink can include a metal or metal precursor. Suitable conductive inks include liquid or liquid dispersions of metals, metal alloys or mixtures thereof. Conductive inks can include, for example, nanoparticles having an average particle size less than 500 nm.

In some embodiments, the conductive ink further comprises a polymeric material. In some embodiments, the polymeric material can include more than one or more polymers, copolymers or polymer blends. Suitable polymeric materials can be thermoplastic or thermoset polymers. The polymeric material can include, for example, conductive polymers, nonconductive polymers or combinations thereof.

In some embodiments, the polymeric material can be cured after displacing the first liquid with the second liquid from at least a portion of the structured surface region. The polymeric material can be "cured" by removing liquid, hardening, or by crosslinking the polymeric material. In some embodiments, the polymeric material can comprise a crosslinker or an additive to facilitate chain extension and/or crosslinking of the polymeric material.

In some embodiments, a structured surface region with a conductive ink disposed within the recessed features can be backfilled with an adhesive or refractive index matching material. Backfilling has been described above.

In some embodiments, conductive inks, conductive inks comprising a polymeric material, or conductive inks comprising a cured polymeric material selectively located within the recessed features are electrolessly plated. Electroless plating is described below within the present disclosure.

In some embodiments, structured surface regions with electrolessly plated conductive inks, electrolessly plated conductive inks having a polymeric material, or electrolessly plated conductive inks having a cured polymeric material can be backfilled with an adhesive or a refractive index matching material as described above.

In some embodiments, conductive inks, conductive inks comprising a polymeric material, or conductive inks comprising a cured polymeric material selectively located within the recessed features are electrolytically plated. Electrolytic plating is described in Mohler, J. B., *Electroplating and Related Processes*, Chemical Publishing Company, New York (1969); U.S. Pat. No. 5,137,611 (Roberts et al.); and U.S. Pat. No. 6,632,343 (Farnsworth et al.).

In some embodiments, structured surface regions electrolytically plated conductive inks, electrolytically plated conductive inks having a polymeric material, or electrolytically plated conductive inks have a cured polymeric material can be backfilled with an adhesive or a refractive index matching material as described above.

In some embodiments of the methods of the present disclosure, the first liquid can be an electroless plating catalyst. In other embodiments, the first liquid can be an electroless plating catalyst precursor. Some suitable electroless plating catalysts include, for example, palladium, platinum, rhodium, silver, gold, copper, nickel, cobalt, iron, and tin, as well as alloys and compounds of the elements with each other or with other elements. In some embodiments, the electroless plating catalyst comprises silver, platinum, and the like or combinations thereof.

In some embodiments, the first liquid can be an electroless plating catalyst precursor. Suitable electroless plating catalyst precursors include, for example, alkoxides, carboxylates, and halides of palladium, platinum, rhodium, silver, gold, copper, nickel, cobalt, iron, and tin, as well as alloys and compounds of the elements with each other or with other elements. In some embodiments, the electroless plating catalyst precursor comprises palladium acetate. In some embodiments, the electroless plating catalyst precursor comprises metal organic palladium compounds including palladium diketonates such as palladium 2,4-pentanedionate. An electroless plating catalyst precursor can be converted to an electroless plating catalyst by a conversion step as described below.

In some embodiments, the electroless plating catalyst selectively located in the recessed features can be electrolessly plated with, for example, an electroless plating bath. The electroless plating or deposition refers to a process for the autocatalytic plating of conductive materials such as metals. This process typically involves the use of an electroless plating solution that contains a soluble form of the deposit metal together with a reducing agent. The soluble form of the deposit metal is usually an ionic species or a metal complex (that is, a metal species coordinated to one or more ligands). Electroless deposition does not require the application of electrical current to a work piece that is being coated. The process of electroless plating is described by Mallory and J. B. Hajdu in *Electroless Plating—Fundamentals and Applications*, ed. G. O. Norwich (1990).

Some of the steps involved in electroless plating include preparing the structured surface region with a catalytic surface (that is, electroless plating catalyst), and immersing the substrate having the structured surface region into an appropriate plating bath. The catalytic surface of the electroless plating catalyst catalyzes the deposition of metal from the electroless plating solution. Once started, plating proceeds by the continued reduction of the solution metal source catalyzed by its own metal surface, hence the term "autocatalytic." Metal deposits that can be formed using electroless plating include, for example, copper, nickel, gold, silver, palladium, rhodium, ruthenium, tin, cobalt, zinc, as well as alloys of these metals with each other or with phosphorous or boron, as well as compounds of these metals with each other or with phosphorous or boron. Suitable reducing agents include, for example, formaldehyde, hydrazine, aminoboranes, and hypophosphite. The electroless plated metal and the metal of the electroless plating catalyst collected on the structured surface region of the substrate can be the same or different. Electroless plating is further described in U.S. Pat. No. 7,160,583 (Frey et al.).

In some embodiments, the first liquid comprises an electroless plating catalyst precursor. The electroless plating catalyst precursor can be heated for forming an electroless plating catalyst. Techniques useful for heating the electroless plating catalyst precursor include, for example, convection, radiation, and combinations thereof. In some embodiments, the electroless plating catalyst precursor can undergo photolytic decomposition to form an electroless plating catalyst. In some embodiments, the resulting electroless plating catalyst can be electrolessly plated as described above to form electrolessly plated structured surface regions.

In some embodiments, the electrolessly plated structured surface region can be backfilled with an adhesive or a refractive index matching material as described above.

In some embodiments, the first liquid comprises a polymeric composition. Polymeric compositions suitable for first liquids having electroless plating catalysts include, for example, thermoplastic polymers such as polyimides, polyolefins, acrylics, styrenes, and the like, or combinations thereof. Some suitable thermoset polymers include, for example, polyamides, polyepoxides, phenolic polymers, polyimides, acrylic polymers, polyurethanes, silicone polymers, and the like, or combinations thereof.

The electroless plating catalyst comprising a polymeric material can be cured. The polymeric material can be cured by removing liquid, hardening, or by crosslinking the polymeric material. In some embodiments, the polymeric material can comprise a crosslinker or an additive to facilitate chain extension and/or crosslinking of the polymeric material. The electroless plating catalyst comprising a cured polymeric material can be electrolessly plated as described above.

In some embodiments, electrolessly plated structured surface regions having a polymeric material, or electrolessly plated structured surface regions have a cured polymeric material can be backfilled with an adhesive or a refractive index matching material as described above.

In some embodiments of the methods of the present disclosure, the first liquid can be a mask material. The mask material refers to a material applied to a substrate providing protection of a substrate during processing, and which can be removed subsequently to expose the substrate. The mask material can be useful for masking metal layers or metal containing microstructures on structured surface regions of substrates. The mask material can comprise, for example, a polymeric material, an inorganic material, a particle filled composite, or combinations thereof. Some suitable polymeric materials include, for example, polyacrylates, poly (meth)acrylates, polyesters, polycarbonates, polyimides, and the like, or combinations thereof. The polymeric material can provide protection or isolation of the structured surface region prior to a chemical or physical modification of the structured surface region. The polymeric material can include, for example, one or more polymers, copolymers, or polymer blends. The particle filled composite can comprise microparticles, nanoparticles, or combinations thereof, combined with a cellulosic material, a polymeric binder, and the like. The particles can be particle oxides, surface modified particles, and the like or combinations thereof.

In some embodiments, the mask material can be a polymeric material. The polymeric mask material can be cured. In some embodiments, the mask material can be a particle filled composite.

In some embodiments, a metal layer can be deposited on the mask material collected on the recessed features and on the remainder of the structured surface region which can be substantially free of the mask material. The metal layer can be deposited by physical or chemical vapor deposition techniques including, for example, sputtering or evaporation methods.

In some embodiments, the metal layer deposited on the mask material located in the recessed features can be removed. In the method described herein, the mask may be regarded as a lift-off mask. The metal layer can remain on the remainder (for example, protrusive regions) of the structured surface region (that is, the regions without the mask material). The mask material and the metal layer deposited on the mask material can be removed from the structured surface region by dissolving, heating, degrading or combinations thereof.

In some embodiments, the structured surface region having a metal layer residing on the remainder of the structured surface region can be can be backfilled with an adhesive or refractive index matching material.

In one aspect, a method of forming a patterned substrate is provided. The method includes (a) providing a substrate comprising a metallized structured surface region comprising a metal layer disposed on the structured surface region such that the metallized structured surface region comprises one or more recessed features and a surface region complementary to the one or more recessed features; (b) disposing a first liquid onto at least a portion of the metallized structured surface region; (c) contacting the first liquid with the second liquid; (d) displacing the first liquid with the second liquid from at least a portion of the metallized structured surface region such that the first liquid is selectively located in at least a portion of the one or more recesses; and (e) dissolving at least a portion of the metal layer into the second liquid selectively from the surface region complementary to the one or more recessed features.

In one embodiment, the second liquid is substantially immiscible with the first liquid.

The term "surface region complementary" generally refers to a region or an area of the structured surface region adjacent to the one or more recessed features. The "surface region complementary" can also be referred to as the "complementary surface region" of the present disclosure. For example, a whole structured surface region can comprise the sum of protrusive features and intrusive features. Protrusive features and intrusive features have been described above. The protrusive features, in some contexts, can be referred to as the complementary surface region, which is located adjacent to the recessed features of the structured surface region.

By metallized, what is meant is that the structured surface region includes a metal-containing material layer. Herein, the term metal-containing material layer can be used interchangeably with the term metal layer. Some examples of the metal-containing materials for the metallized structured surface region include elemental metal, metal alloys, metal mixtures, intermetallic compounds, metal oxides, metal sulfides, metal carbides, metal nitrides, and combinations thereof. Exemplary metals include, for example, gold, silver, palladium, platinum, rhodium, copper, nickel, iron, indium, tin, tantalum, titanium, chromium, tungsten.

Figure 6A:
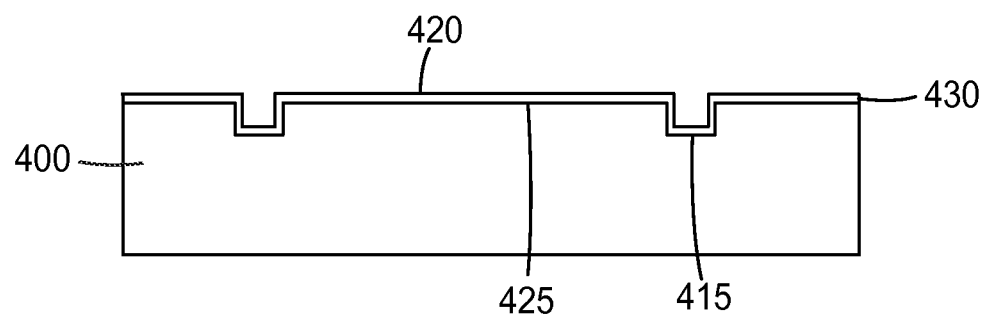
FIG. 6A is a schematic representation of a substrate having a metallized structured surface region comprising one or more recessed features.

FIG. 6A illustrate a metallized substrate comprising a metallized structured surface region 400 having metallized recessed features 415, metallized protrusive features 420, and a metal layer 430. A metal layer-structured surface region interface 425 is formed where the metal layer 430 contacts the metallized structured surface region 400 of the metallized substrate.

In some embodiments, the recessed features or at least a portion of the recessed features of the metallized structured surface region can comprise a first liquid, or a first liquid comprising a polymeric material, or a first liquid comprising a cured polymeric material selectively located in at least a portion of the one or more recesses. In some embodiments, the first liquid can be cured. Curing of the first liquid can occur by removing a fluid of the first liquid, drying the first liquid, or by crosslinking.

Figure 6B:
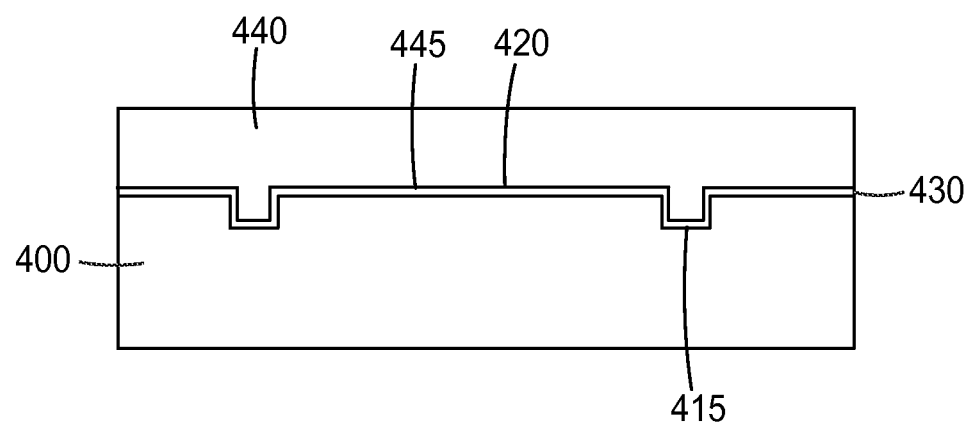
FIG. 6B is a schematic representation of a first liquid contacting at least a portion of the metallized structured surface region of the substrate.

FIG. 6B illustrates a metallized substrate comprising a metallized structured surface region 400 having metallized recessed features 415, metallized protrusive features 420, and a metal layer 430 contacted by a first liquid 440. The first liquid 440 resides in the metallized recessed features 415 and on the metallized protrusive features 420. A first liquid-metal structured surface region interface 445 is formed where the metal layer 430 contacts the first liquid 440.

In another embodiment, the first liquid comprises a resist material. As used herein, "resist material" refers to a material used as a coating of a metal-containing layer that protects the metal-containing layer from chemical and/or physical action (for example, metal etching by a subtractive process). Suitable examples of resist materials include a polymeric material, an inorganic material, and the like, or combinations thereof. Resist materials are described in U.S. Pat. No. 6,077,560 (Moshrefzadeh et al.).

Some examples of commercial resist materials include photoresists such as a resist under the trade designation SHIPLEY RESIST 1400-37 from Shipley Company of Marlborough, Mass.; resist under the trade designation RONASCREEN 2400 from LeaRonal of Freeport, N.Y.; and another photoresist under the trade designation DANOCURE 1173 (isobornyl acrylate with photoinitiator) from UCB Chemicals Corporation of Smyrna, Ga.

Some examples of inorganic resist materials include, for example, metal oxides and metal nitrides, inorganic semiconductors, metals, and the like. Representative examples of useful metal oxides and metal nitrides include, for example, silicon oxides, aluminum oxides, tantalum oxides, titanium oxides, silicon nitrides, barium titanate, barium strontium titanate, barium zirconate titanate, and the like. The complementary regions of the metallized structured surface region can be substantially free of the displaced first liquid after contact with a second liquid. The metal layer of the complementary regions of the structured surface region can be etched by having at least a portion of the metal layer removed from the metallized surface region. Materials for removing or etching the complementary regions of the metallized structured surface region are described below. The first liquid located in the recesses of the structured surface region can protect the metal layer disposed beneath the first liquid during etching procedures. In some embodiments, the second liquid etches the metal from the protrusive features, or from the complementary regions of the metallized structured surface region.

In some embodiments, the first liquid can be cured. Monomeric precursors (reactive monomers) that can be deposited and subsequently cured (for example, UV or e-beam curing) can also be used. In addition, small molecules such as, for example, organic glasses, crystalline organics, and the like can be used.

Figure 6C:
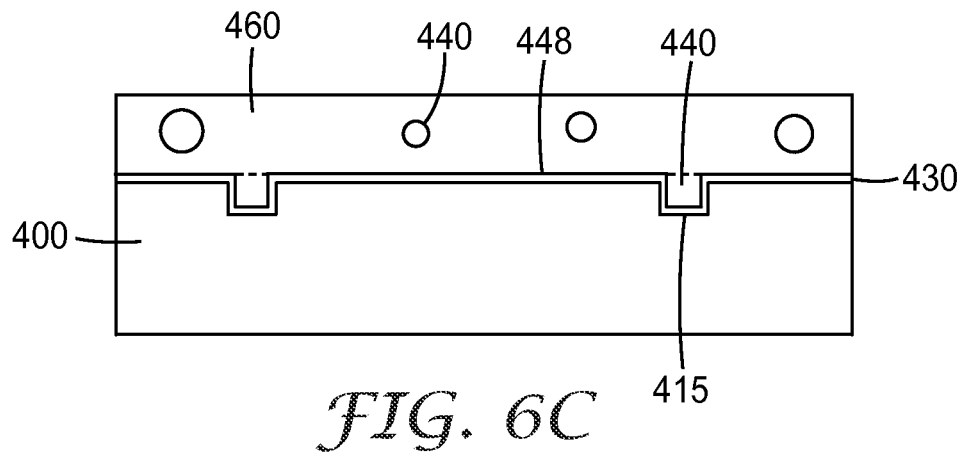
FIG. 6C is a schematic representation of the first liquid selectively located in the recessed features.

FIG. 6C illustrates a metallized substrate comprising a metallized structured surface region 400 where the first liquid 440 is contacted with a second liquid 460 forming a second liquid-metallized structure surface region interface 448. The first liquid 440 is displaced from the metallized protrusive features 420. The first liquid 440 is selectively located in the metallized recessed features 415 of the metallized structured surface region 400.

In the method of the present disclosure, at least a portion of the metal layer can be selectively dissolved by the second liquid after the first liquid is selectively located in the recesses. The second liquid comprising a solvent and an etchant can remove or etch the metal layer from the surface region complementary to the one or more recesses features.

Figure 6D:
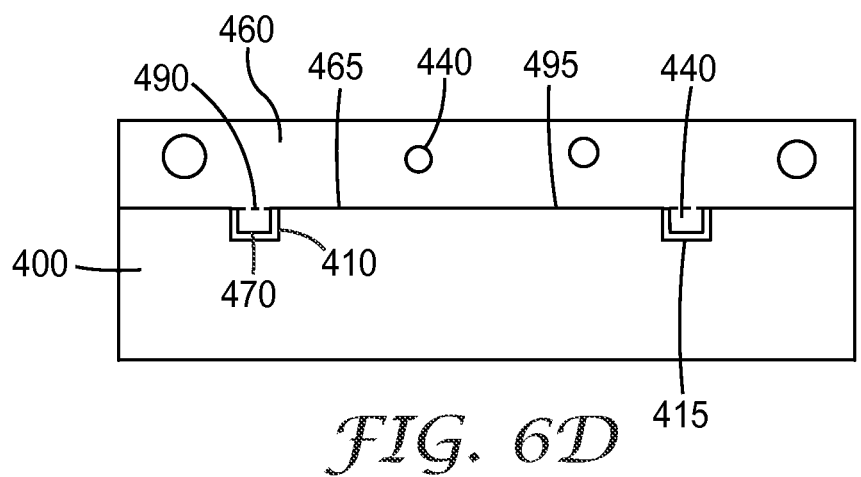
FIG. 6D is a schematic representation of a second liquid dissolving at least a portion of the metal layer of the metallized structured surface region.

FIG. 6D illustrates a metallized substrate comprising a metallized structure surface region 400 where the first liquid 440 resides in the metallized recessed features 415 after being displaced by the second liquid 460 for forming a first liquid-second liquid interface 490. A first liquid-metallized recessed feature interface 470 forms where the first liquid 440 contacts the metallized recessed feature 415 having metal layer 410. The second liquid 460 dissolves (for example, etches) the metal layer from the metallized protrusive features 420 forming protrusive features 495. A protrusive feature-second liquid interface 465 forms where the second liquid 460 contacts the protrusive feature 495.

The second liquid selectively etches the metal layer from surface regions unmasked by the first liquid. Application of the second liquid and subsequent removal of a layer is an example of wet chemical etching. Wet chemical etching typically involves the removal of material (for example, metal) by immersing the substrate having a metallized structured surface region in a liquid bath of a chemical etchant or by spraying the metallized structured surface region with a chemical etchant that reacts with the metal-containing material layer (for example, metal layer) on the metallized structured surface region. Representative examples of etchants include, for example, HF, HF:$NH_4F$, KOH, ethylenediamine pyrocatechol (EDP), CsOH, NaOH, and hydrazine ($N_2H_4$—$H_2O$) for silicon; HCl:glycerin, iodine, KI:$I_2$:$H_2O$, and $HNO_3$ for metals; and HF and HCl for metal oxides or nitrides. Liquid removal of metal-containing material layers typically involves exposing the metallized structured surface region to a second liquid in which the layer can be soluble (for example, dissolves). Useful solvents for second liquids include, for example, water, acetone, toluene, hexane, heptane, cyclohexane, and the like, and mixtures thereof. In some embodiments, dissolving the metal layer into the second liquid selectively further comprises agitation. Agitation facilitates contact of the first liquid with the second liquid, and dissolving the metal layer from the surface region complementary to the one or more recessed features into the second liquid.

In some embodiments, the first liquid comprises a polymeric material, or the first liquid comprises a cured polymeric material that can be removed from the recessed features of the metallized structured surface region after etching the metal layer from the surface region complementary to the recessed features of the metallized structured surface region. Upon removal of the first liquid from the recessed features, the metal layer of the metallized structured surface region can be exposed within the recessed features. The first liquid can be removed by heating, dissolving, degradation or other methods known to those of skill in the art.

In some embodiments, the metallized structured surface region after patterning of the metal-containing material layer by etching and optionally removing the first liquid, can be backfilled with an adhesive or refractive index matching material. Backfilling has been described above.

Figure 6E:
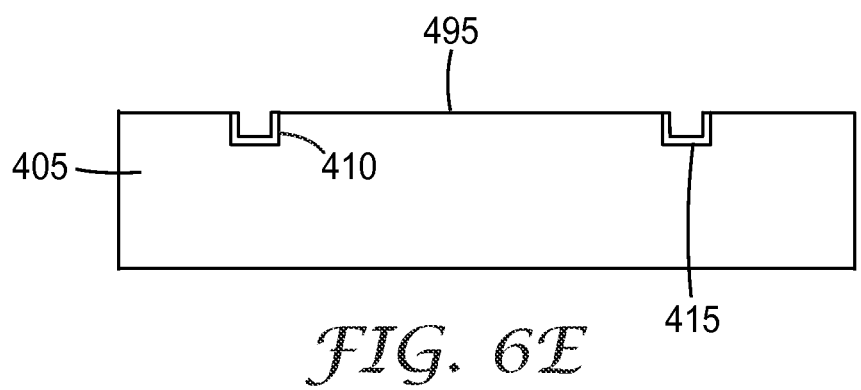
FIG. 6E is a schematic representation of a substrate having a metallized structured surface region after etching.

FIG. 6E illustrates an etched structured surface region 405 after removal of the second liquid 460 and the first liquid 440. The metallized surface features 415 comprise a metal layer 410. The protrusive features 495 have the metal layer removed.

In some embodiments, the etched metallized structured surface region, wherein the metal layer is selectively located in recessed features, can be further backfilled using any of the aforementioned backfilling materials, methods, and constructions.

The patterned substrates of the current disclosure can be utilized in many applications. In some embodiments, the patterned substrates include conductive features having sufficiently small minimum dimensions (for example, width of a line) that are invisible, or nearly invisible to the naked eye. Some applications using the patterned substrates include, for example, electronic circuitry such as flexible circuitry. Other applications using the patterned substrates include devices requiring electrodes. Some examples of electrodes include, for example, essentially planar electrodes, flexible electrodes, and the like, that are electrically conductive and light transmitting over large areas (for example, large areas greater than 1 cm², greater than 500 cm², or greater than 1 m²). Some examples of devices that include electrodes include, for example, electrochromic windows and displays, electroluminescent lamps, resistively heated windows, touch screen displays, and the like. Other applications using patterned substrates can include use in shielding electromagnetic radiation, for example, electromagnetic interference (EMI). Examples of the latter include electronic information displays, for example, as plasma display panels (PDP).

The disclosure will be further clarified by the following examples which are exemplary and not intended to limit the scope of the disclosure.

EXAMPLES

The present disclosure is more particularly described in the following examples that are intended as illustrations only, since numerous modifications and variations within the scope of the present disclosure will be apparent to those skilled in the art. Unless otherwise noted, all parts, percentages, and ratios reported in the following examples are on a weight basis, and all reagents used in the examples were obtained, or are available, from the chemical suppliers described below, or can be synthesized by conventional techniques.

Example 1

A polymeric substrate comprising a structured surface region was prepared by molding a polymeric substrate against a structured tool. The structured tool had a 10 centimeter diameter plate of fused quartz with a pattern of approximately 10 micrometers wide and approximately 10 micrometer high raised ridges. The raised ridges were in the form of a square grid with a pitch of approximately 200 micrometers. The tool was fabricated according to methods known in the art, based on photolithography and reactive ion etching.

The resin formulation suitable for coating onto the polymeric material comprised 74.25 weight % (wt. %) Photomer 6210 (Cognis, Monheim, Germany), 24.75 wt. % SR-238-1, 6-Hexanediol diacrylate (Sartomer, Exton, Pa.), and 1.0 wt. % Darocur 1173 (Ciba Additives, Basel, Switzerland). The resin formulation was mixed at room temperature to combine the components. The resin formulation was knife coated onto the polymeric material. After application of the resin formulation to the polymeric material, the resin formulation was cured between the tool, and a sheet of polymeric material (polyethylene terephthalate (PET); 125 micrometer thickness; Melinex, Dupont Teijin Films, Hopewell, Va.), using an ultraviolet lamp (Blak-Ray XX-15BLB UV Bench Lamp, UVP, Upland, Calif.) for about 3 minutes. The polymeric material containing the cured resin formulation was separated from the tool to provide a polymeric substrate comprising a structured surface region.

The polymeric substrate comprising the structured surface region had recessed channels in the form of a square grid with a pitch of approximately 200 micrometers. The channels of the structured surface region had dimensions of approximately 10 micrometers in width and approximately 10 micrometers in depth.

The polymeric substrate was vapor coated with about 30 angstroms of chromium (Cr; 99.9% pure rod; R. D. Mathis Company, Signal Hill, Calif.), followed by coating about 250 nanometers of silver (Ag; 99.99% pure 3 mm shot; Lot #200G; Cerac Incorporated, Milwaukee, Wis.) onto the chromium vapor coated layer using an evaporative coater (Denton Vacuum Coater DV-502A; Denton Vacuum USA, Moorestown, N.J.) for forming a metallized polymeric substrate comprising a metal layer forming a metallized structured surface region.

The metallized polymeric substrate was dip-coated by hand in hexanes ($C_6H_{14}$, 98.5%; EMD, Darmstadt, Germany) providing the first liquid. Hexanes were disposed onto the metallized polymeric substrate and the metallized structured surface region. Hexanes coated the recessed features and the protrusive features of the metallized polymeric substrate.

The metallized polymeric substrate was immersed in an aqueous silver etchant solution. The aqueous silver etchant solution comprised 0.02 M ferric nitrate nonahydrate (98+%; EMD, Darmstadt, Germany) and 0.03 M thiourea (99.9%, Aldrich, Milwaukee, Wis.) in deionized water. The hexanes disposed on the metallized polymeric substrate were contacted with the etchant solution. During immersion of the metallized polymeric substrate for about 3 minutes, the metallized polymeric substrate was agitated by hand. The hexanes were displaced from a portion of the metallized structured surface region, and the hexanes were selectively located in at least a portion of the one or more recessed features. The hexanes were displaced from a portion of the protrusive regions of the metallized polymeric substrate. In the regions of the metallized structured surface region without hexanes disposed on its surface, the aqueous etchant solution dissolved (for example, etched) the metal layer to provide regions of the metallized polymeric substrate without a metal layer, and regions of the metallized structured surface region having hexanes disposed within the recessed features containing a metal layer.

Figure 7:
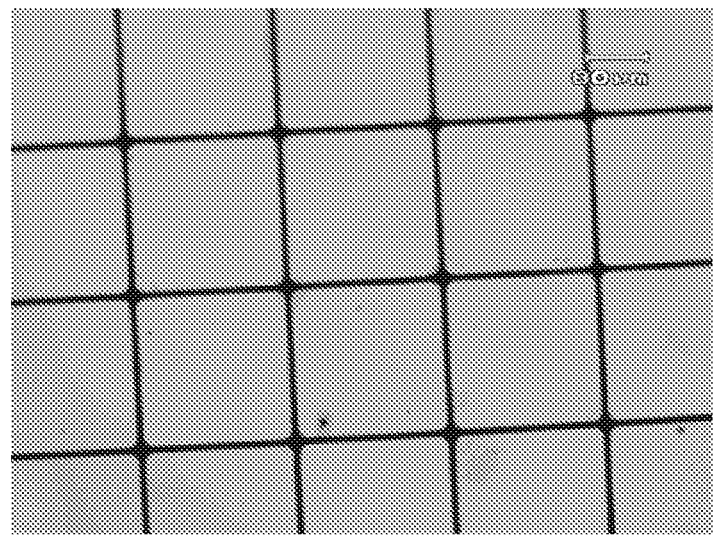
FIG. 7 is an optical micrograph of a patterned substrate of Example 1.

The metallized polymeric substrate after etching was rinsed with deionized water followed by a rinse with ethanol (EtOH, 200 proof, absolute, anhydrous, Pharmco, Brookfield, Conn.). The metallized polymer substrate was dried under a nitrogen atmosphere. After the rinsing with ethanol and water, the hexanes were removed from the recessed features. In the recessed features of the metallized structured surface region, the metal layer remained. The metal layer was masked by the hexanes during etching of the metal layer from the metallized structured surface region. The metal layer of the recessed features of the metallized structured surface region remained in the recessed features as illustrated in the optical micrograph (Olympus BH-2 Optical Microscope; Olympus America, Incorporated, Melville, N.Y.) recorded in transmission of FIG. 7 providing for a patterned substrate having a cross-hatch pattern. FIG. 7 illustrates the silver layer (that is, dark areas) remaining in the recessed features of the metallized polymeric substrate.

Example 2

A polymeric substrate comprising a structured surface region was provided. The structured surface region included a hexagonal array of protrusive features in the shape of hemispheres. The spacing between hemispheres was approximately 100 micrometers. The height of the hemispheres was approximately 23 micrometers. Similar polymeric substrates have been described in U.S. Pat. No. 5,300,263 (Hoopman et al.), U.S. Pat. No. 5,439,621 (Hoopman), and U.S. Patent Application Publication No. 2006/0072199 (Morishita et al.). Suitable substrates are available commercially under the trade designation MICRO OPTICS MICROLENS ARRAY from Leister Process Technologies, Axetris Microsystems Division of Riedstrasse, Switzerland.

The polymeric substrate was vapor coated with about 10-30 angstroms of chromium ((Cr; 99.9% pure rod; R. D. Mathis Company, Signal Hill, Calif.), followed by coating about 70 nanometers of gold (Au; 99.999% pure gold splatters; Cerac, Incorporated, Milwaukee, Wis.) onto the chromium vapor coated layer using an evaporative coater (Denton Vacuum Coater DV-502A; Denton Vacuum USA, Moorestown, N.J.) for forming a metallized polymeric substrate comprising a metal layer forming a metallized structured surface region.

The metallized polymeric substrate was dip-coated by hand in tetradecane ($C_{14}H_{30}$, 99.9%; Aldrich, Milwaukee, Wis.), providing the first liquid. Tetradecane was disposed onto the metallized polymeric substrate and the metallized structured surface region. Tetradecane coated the recessed features and the protrusive features of the metallized polymeric substrate.

The metallized polymeric substrate was immersed in an aqueous gold etchant solution. The aqueous gold etchant solution comprised 1.0176 g thiourea (99.9%; Aldrich, Milwaukee, Wis.), 0.55 ml hydrochloric acid (HCl, 36.5-38%; J. T. Baker, Phillipsburg, Mass.), 0.5 ml hydrogen peroxide ($H_2O_2$, 30% in water; Mallinckrodt Baker, Incorporated, Phillipsburg, Mass.), and 21 g deionized water. The tetradecane disposed on the metallized polymeric substrate was contacted with the etchant solution. During immersion of the metallized polymeric substrate for about 1 minute, the metallized polymeric substrate was agitated by hand. The tetradecane was displaced from a portion of the metallized structured surface region, and the tetradecane was selectively located in at least a portion of the one or more recessed features. The tetradecane was displaced from a portion of the protrusive regions of the metallized polymeric substrate. In the regions of the metallized structured surface region without tetradecane disposed on its surface, the aqueous etchant solution dissolved (for example, etched) the metal layer to provide regions of the metallized polymeric substrate without a gold layer, and regions of the metallized structured surface region having tetradecane disposed within the recessed features containing a gold layer.

Figure 8:
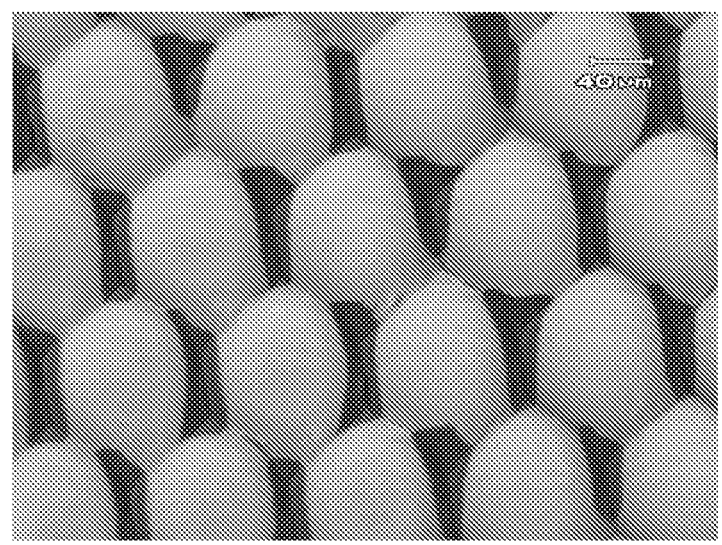
FIG. 8 is an optical micrograph of a patterned substrate of Example 2.

The metallized polymeric substrate was rinsed with deionized water followed by a rinse with ethanol (EtOH, 200 proof, absolute, anhydrous, Pharmco, Brookfield, Conn.). The metallized polymeric substrate was dried under a nitrogen atmosphere. After rinsing with ethanol and water, the tetradecane was removed from the recessed features. In the recessed features of the metallized structured surface region, the metal (for example, gold) layer remained. The metal layer was masked by the tetradecane during etching of the metal layer from the metallized structured surface region. The metal layer of the recessed features of the metallized structured surface region remained in the recessed features as illustrated in the optical micrograph (Olympus BH-2 Optical Micrograph; Olympus, America, Incorporated, Melville, N.Y.) recorded in transmission of FIG. 8 providing for a patterned substrate. FIG. 8 illustrates the gold layer (that is, dark regions) remaining in the recessed features of the metallized polymeric substrate. The resulting polymer film substrate included gold remaining selectively in the recessed regions surrounding the hemispherical lenses, as illustrated in FIG. 8.

Example 3

A polymeric substrate comprising a structured surface region of Example 2 was provided. The polymeric substrate was similarly coated with a chromium layer and a gold layer for forming a metallized polymeric substrate comprising a metal layer forming a structured surface region as described in Example 2.

The metallized polymeric substrate was dip-coated by hand in hexadecane ($C_{16}H_{34}$, 99%; Alfa Aesar, Ward Hill, Mass.), providing the first liquid. Tetradecane was disposed onto the metallized polymeric substrate and the metallized structured surface region. Tetradecane coated the recessed features and the protrusive features of the metallized polymeric substrate.

The metallized polymeric substrate was immersed in an aqueous gold etchant solution of Example 2. The hexadecane disposed on the metallized polymeric substrate was contacted with the aqueous gold etchant solution. During immersion of the metallized polymeric substrate for about 1 minute, the metallized polymeric substrate was agitated by hand. The hexadecane was displaced from a portion of the metallized structured surface region, and the hexadecane was selectively located in at least a portion of the one or more recessed features. The hexadecane was displaced from a portion of the protrusive regions of the metallized polymeric substrate. In the regions of the metallized structured surface region without hexadecane disposed on its surface, the aqueous etchant solution dissolved (for example, etched) the metal layer to provide regions of the metallized polymeric substrate without a gold layer, and regions of the metallized structured surface region having hexadecane disposed within the recessed features containing a gold layer.

Figure 9:
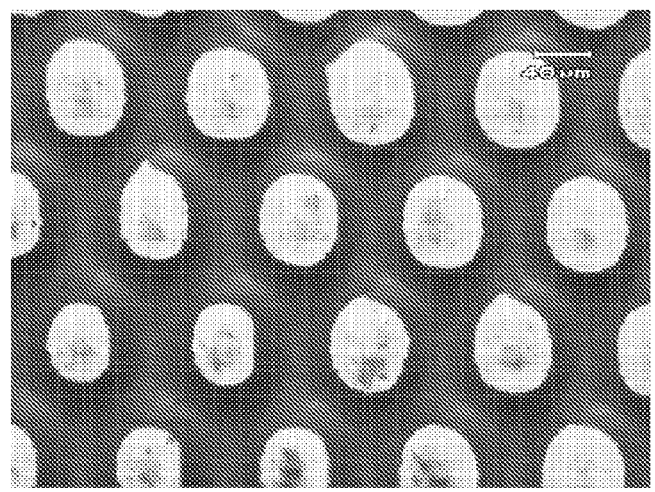
FIG. 9 is an optical micrograph of a patterned substrate of Example 3.

The metallized polymeric substrate was rinsed with deionized water followed by a rinse with ethanol (EtOH, 200 proof, absolute, anhydrous, Pharmco, Brookfield, Conn.). The metallized polymeric substrate was dried under a nitrogen atmosphere. After rinsing with ethanol and water, the hexadecane was removed from the recessed features. In the recessed features of the metallized structured surface region, the metal (for example, gold) layer remained. The metal layer was masked by the hexadecane during etching of the metal layer from the metallized structured surface region. The metal layer of the recessed features of the metallized structured surface region remained in the recessed features as illustrated in the optical micrograph (Olympus BH-2 Optical Micrograph; Olympus, America, Incorporated, Melville, N.Y.) recorded in transmission of FIG. 9 providing for a patterned substrate. FIG. 9 illustrates the gold layer (that is, dark areas) remaining in the recessed features of the metallized polymeric substrate. The resulting polymer film substrate included gold remaining selectively in the recessed regions surrounding the hemispherical lenses, as illustrated in FIG. 9.

Example 4

A polymeric substrate comprising a structured surface region was prepared by molding a polymeric substrate against a structured tool. The structured tool had a 33 centimeter length by a 27 centimeter width nickel plate having a pattern of raised ridges having dimensions of approximately 2.5 micrometers in width and approximately 2 to 12 micrometer in height. The raised ridges were in the form of sinusoidal traces approximately 4 millimeter apart, extending approximately 66% of the length of the structured tool. The tool was fabricated according to methods known in the art, based on nickel forming from an excimer laser ablation-derived polymer master as similarly described in U.S. Patent Application Publication No. 2007/0231541 (Humpal et al.).

The resin formulation suitable for coating onto the polymeric material of Example 1 was knife coated onto the polymeric substrate. After application of the resin formulation to the polymeric material, the resin formulation was cured between the tool, and a sheet of polymeric material (polyethylene terephthalate (PET); 125 micrometer thickness;

Melinex, Dupont Teijin Films, Hopewell, Va.), using an ultraviolet lamp (Blak-Ray XX-15BLB UV Bench Lamp, UVP, Upland, Calif.) for about 2 minutes. The polymeric material containing the cured resin formulation was separated from the tool to provide a polymeric substrate comprising a structured surface region.

The polymeric substrate comprising the structured surface region had recessed channels in the form of sinusoidal grooves with a pitch of approximately 4,000 micrometers; the channels of the structured surface region had dimensions of approximately 2.5 micrometers in width, and approximately 2 to 12 micrometers in depth.

The polymeric substrate was vapor coated with about 70 angstroms of chromium (Cr; 99.9% pure rod; R. D. Mathis Company, Signal Hill, Calif.), followed by coating about 70 nanometers of gold (Au; 99.999% pure Au splatters; Cerac Incorporated, Milwaukee, Wis.) onto the chromium vapor coated layer using an evaporative coater (Denton Vacuum Coater DV-502A; Denton Vacuum USA, Moorestown, N.J.) for forming a metallized polymeric substrate comprising a metal layer forming a metallized structured surface region.

The metallized polymeric substrate was dip-coated by hand in hexadecane ($C_{16}H_{34}$, 99%; Aldrich, St. Louis, Mo.) providing the first liquid. Hexadecane were disposed onto the metallized polymeric substrate and the metallized structured surface region. Hexadecane coated the recessed features and the protrusive features of the metallized polymeric substrate.

Figures 10A, 10B:
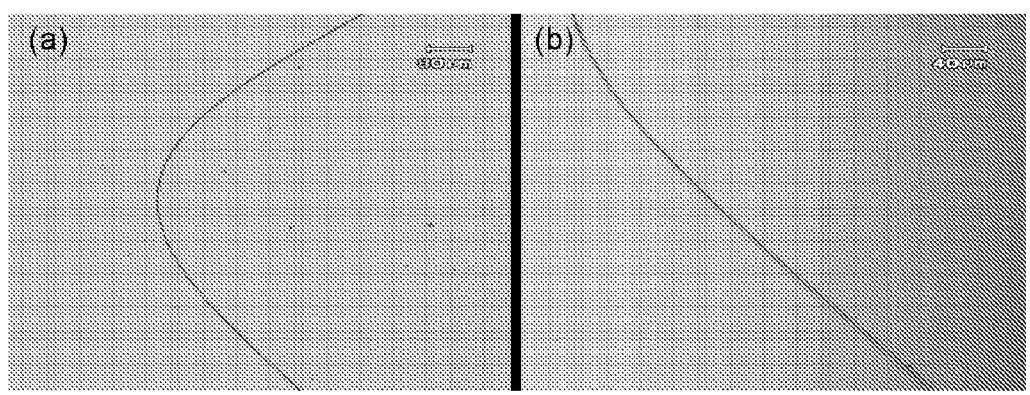
FIGS. 10A-B are optical micrographs of a patterned substrate of Example 4.

The metallized polymeric substrate was immersed in an aqueous gold etchant solution comprising 4 g potassium iodide (KI, 99%; Aldrich, Milwaukee, Wis.), 1 g iodine ($I_2$, 99+%; Alfa Aesar, Avocado, Lancaster, United Kingdom) and 40 g of deionized water. The hexadecane disposed on the metallized polymeric substrate was contacted with the etchant solution. During immersion of the metallized polymeric substrate for about 12 seconds, the metallized polymeric substrate was agitated by hand. The hexadecane was displaced from a portion of the metallized structured surface region, and the hexadecane was selectively located in at least a portion of the one or more recessed features. The hexadecane was displaced from a portion of the protrusive regions of the metallized polymeric substrate. In the regions of the metallized structured surface region without hexadecane disposed on its surface, the aqueous etchant solution dissolved (for example, etched) the metal layer to provide regions of the metallized polymeric substrate without a metal layer, and regions of the metallized structured surface region having hexadecane disposed within the recessed features containing a metal layer. The metallized polymeric substrate after etching was rinsed with deionized water followed by a rinse with ethanol (EtOH, 200 proof, absolute, anhydrous, Pharmco, Brookfield, Conn.). The metallized polymer substrate was dried under a nitrogen atmosphere. After the rinsing with ethanol and water, the hexadecane was removed from the recessed features. In the recessed features of the metallized structured surface region, the metal layer remained. The metal layer was masked by the hexadecane during etching of the metal layer from the metallized structured surface region. The metal layer of the recessed features of the metallized structured surface region remained in the recessed features as illustrated in the optical micrograph (Olympus BH-2 Optical Microscope; Olympus America, Incorporated, Melville, N.Y.) recorded in transmission of FIGS. 10A-B providing for a patterned substrate. FIGS. 10A-B illustrates the metal layer (that is, silver; dark regions)) remaining in the recessed features of the metallized polymeric substrate. FIG. 10A illustrates the gold layer remaining in the recessed features having dimensions of about 2 micrometers in depth and 2.5 micrometers in width. FIG. 10B illustrates the gold layer remaining in the recessed channels having dimensions of about 7 micrometers in depth and 2.5 micrometers in width.

Example 5

A polymeric substrate comprising a structured surface region was provided. The structured surface region included recessed channels in the form of a parallel array having a pitch of approximately 2,000 micrometers. The recessed channels had dimensions of approximately 20 micrometers in width and approximately 10 micrometers in depth.

The polymeric substrate was vapor coated with about 15 angstroms of titanium (Ti; 99.9%; Alfa Aesar, Ward Hill, Mass.), followed by coating about 100 nanometers of silver (Ag; 99.99% pure 3 mm shot; Cerac Incorporated, Milwaukee, Wis.) onto the titanium vapor coated layer using an evaporative coater similar to the Denton Vacuum Coater (DV-502A; Denton Vacuum USA, Moorestown, N.J.) used in Example 5 above, and known to those skilled in the art for forming a metallized polymeric substrate comprising a metal layer forming a metallized structured surface region.

The metallized polymeric substrate was dip-coated by hand in 1,2-propanediol ($C_3H_8O_2$, 99.5+% Aldrich, Milwaukee, Wis.) providing the first liquid. First liquid, 1,2-propanediol was disposed onto the metallized polymeric substrate and the metallized structured surface region. First liquid, 1,2-propanediol was coated the recessed features and the protrusive features of the metallized polymeric substrate.

The metallized polymeric substrate was immersed in an aqueous silver etchant solution. The aqueous silver etchant solution comprised 0.02 M ferric nitrate nonahydrate (98+%; EMD, Darmstadt, Germany) and 0.03 M thiourea (99.9%, Aldrich, Milwaukee, Wis.) in deionized water. The 1,2-propanediol disposed on the metallized polymeric substrate was contacted with the etchant solution. During immersion of the metallized polymeric substrate for about 2 minutes, the metallized polymeric substrate was agitated using a Teflon coated magnetic stirrer and a magnetic stir plate. The 1,2-propanediol was displaced from a portion of the metallized structured surface region, and the 1,2-propanediol was selectively located in at least a portion of the one or more recessed features. The 1,2-propanediol was displaced from a portion of the protrusive regions of the metallized polymeric substrate. In the regions of the metallized structured surface region without 1,2-propanediol disposed on its surface, the aqueous etchant solution dissolved (for example, etched) the silver layer to provide regions of the metallized polymeric substrate without the silver layer, and regions of the metallized structured surface region having 1,2-propanediol disposed within the recessed features containing a silver layer.

Figure 11:
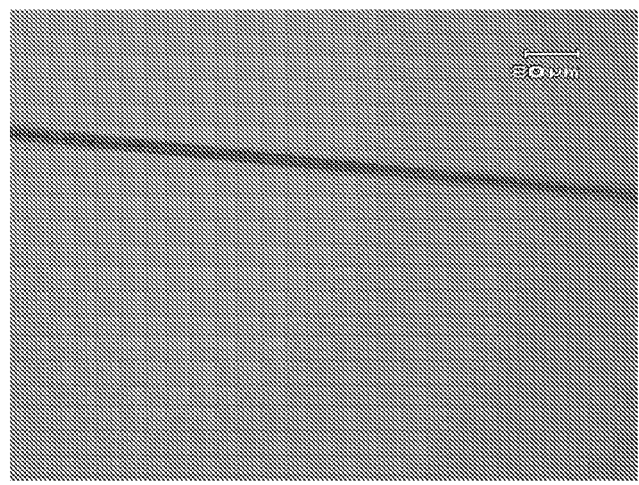
FIG. 11 is an optical micrograph of a patterned substrate of Example 5.

The metallized polymeric substrate was rinsed with deionized water followed by a rinse with ethanol (EtOH, 200 proof, absolute, anhydrous, Pharmco, Brookfield, Conn.). The metallized polymeric substrate was dried under a nitrogen atmosphere. After rinsing with ethanol and water, the 1,2-propanediol was removed from the recessed features. In the recessed features of the metallized structured surface region, the metal (for example, silver) layer remained. The metal layer was masked by the 1,2-propanediol during etching of the metal layer from the metallized structured surface region. The metal layer of the recessed features of the metallized structured surface region remained in the recessed features as illustrated in the optical micrograph (Olympus BH-2 Optical Micrograph; Olympus, America, Incorporated, Melville, N.Y.) recorded in transmission of FIG. 11 providing for a patterned substrate. FIG. 11 illustrates the metal layer (that is, silver; dark regions) remaining in the recessed features of the metallized polymeric substrate. The resulting polymer film substrate included silver remaining selectively in the recessed channels as illustrated in FIG. 11.

Example 6

A polymer substrate comprising a structured surface region was prepared by molding a polymeric substrate against a structured tool. The structured tool had a length of about 9 centimeters by 8 centimeters width nickel plate having a pattern of raised ridges having dimensions in a range from about 5 micrometers to about 50 micrometers in width and a height of about 2 micrometers. The tool was fabricated according to methods known in the art, based on nickel formed from a pattern of photoresist on a silicon wafer as prepared by standard photolithography techniques.

The resin formulation suitable for coating onto the polymeric material of Example 1 was knife coated onto the polymeric substrate. After application of the resin formulation to the polymeric material, the resin formulation was cured between the tool, and a sheet of polymeric material (polyethylene terephthalate (PET); 125 micrometer thickness; Melinex, Dupont Teijin Films, Hopewell, Va.), using an ultraviolet lamp (Blak-Ray XX-15BLB UV Bench Lamp, UVP, Upland, Calif.) for about 3 minutes. The polymeric material containing the cured resin formulation was separated from the tool to provide a polymeric substrate comprising a structured surface region.

The polymeric substrate comprising the structured surface region had recessed channels in the form of a serpentine pattern with recessed square pads at the ends of the recessed channels. The recessed channels had dimensions of about 5 micrometers to about 50 micrometers in width and a depth of about 2 micrometers.

The polymeric substrate was vapor coated with 30 angstroms of chromium (Cr; 99.9% pure rod; R.D. Mathis Company, Signal Hill, Calif.), followed by coating about 70 nanometers of gold (Au; 99.999% pure Au splatters; Cerac, Incorporated, Milwaukee, Wis.) onto the chromium vapor coated layer using an evaporative coater (Denton Vacuum Coater DV-502A, Denton Vacuum USA, Moorestown, N.J.) for forming a metallized polymeric substrate comprising a metal layer forming a metallized structured surface region.

The metallized polymeric substrate was dip-coated by hand in tetradecane ($C_{14}H_{30}$, 99.9%; Aldrich, Milwaukee, Wis.) providing the first liquid. Tetradecane was disposed onto the metallized polymeric substrate and the metallized structured surface region. Tetradecane coated the recessed features and the protrusive features of the metallized polymeric substrate.

Figure 12:
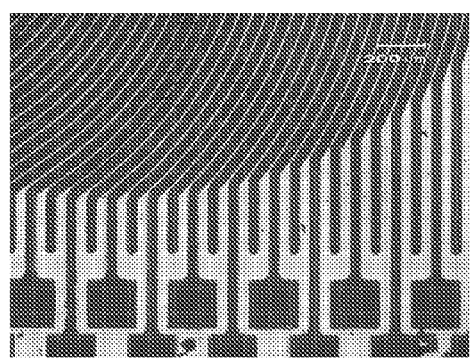
FIGS. 12-13 are optical micrographs of a patterned substrate of Example 6.
Figure 13:
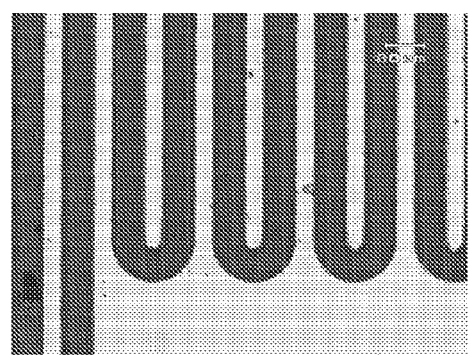

The metallized polymeric substrate was immersed in an aqueous gold etchant solution comprising: 1.0176 g thiourea (99.9%; Aldrich, Milwaukee, Wis.), 0.55 mL hydrochloric acid (HCl, 36.5-38%; J. T. Baker, Phillipsburg, Mass.), 0.5 mL hydrogen peroxide ($H_2O_2$, 30 wt. % in water; Mallinckrodt Baker, Incorporated, Phillipsburg, Mass.) and 21 g deionized water. The tetradecane disposed on the metallized polymeric substrate was contacted with the etchant solution. During immersion of the metallized polymeric substrate for approximately 1 minute, the metallized polymeric substrate was agitated by hand. The tetradecane was displaced from a portion of the metallized structured surface region, and the tetradecane was selectively located in at least a portion of the one or more recessed features. The tetradecane was displaced from a portion of the protrusive regions of the metallized polymeric substrate. In the regions of the metallized structured surface region without tetradecane disposed on its surface, the aqueous etchant solution dissolved (for example, etched) the metal layer to provide regions of the metallized polymeric substrate without a metal layer, and regions of the metallized structured surface region having tetradecane disposed within the recessed features containing a metal layer (that is, gold layer). The metallized polymeric substrate after etching was rinsed with deionized water followed by a rinse with ethanol (EtOH), 200 proof, absolute, anhydrous; Pharmco, Brookfield, Conn.) to remove the tetradecane from the recessed features. The gold layer remained in the recessed features of the metallized structured surface region. The metallized polymer substrate was dried under a nitrogen atmosphere. The metallized structured surface region having gold in the recessed features is illustrated in the optical micrograph recorded in transmission of FIGS. 12-13. The dark regions of the FIGS. 12-13 represent the gold layer (that is, dark regions) of the recessed features. FIG. 12 is an optical micrograph illustrating the gold layer remaining in the recessed features having dimensions of about 2 micrometers in depth and about 2.5 micrometers in width. FIG. 13 is an optical micrograph illustrating the gold layer remaining in the recessed features having dimensions of about 7 micrometers in depth and about 2.5 micrometers in width.

Example 7

A polymeric substrate comprising a surface microstructure was provided. The structured surface region included recessed channels in the form of a parallel array with pitch of approximately 2000 micrometers. The recessed channels had dimensions of approximately 60 micrometers in width and approximately 10 micrometers in depth.

The polymeric substrate was dip-coated by hand in an aqueous 10 mM solution of brilliant blue dye (Aldrich, St. Louis, Mo.) providing the first liquid. The first liquid was disposed onto the polymeric substrate and the structured surface region. The brilliant blue dye solution coated the recessed features and the protrusive features of the polymeric substrate.

The polymeric substrate coated with the brilliant blue dye solution was immersed in decane ($C_{10}H_{22}$, 99.0%; TCI America, Portland, Oreg.). The brilliant blue dye solution was contacted by the decane. During immersion of the polymeric substrate for about 30 seconds, the polymeric substrate was agitated by hand. The brilliant blue dye solution was displaced from a portion of the structured surface region, and the solution was selectively located in at least a portion of the one or more recessed features. The solution was displaced from a portion of the protrusive regions of the polymeric substrate.

Figure 14:
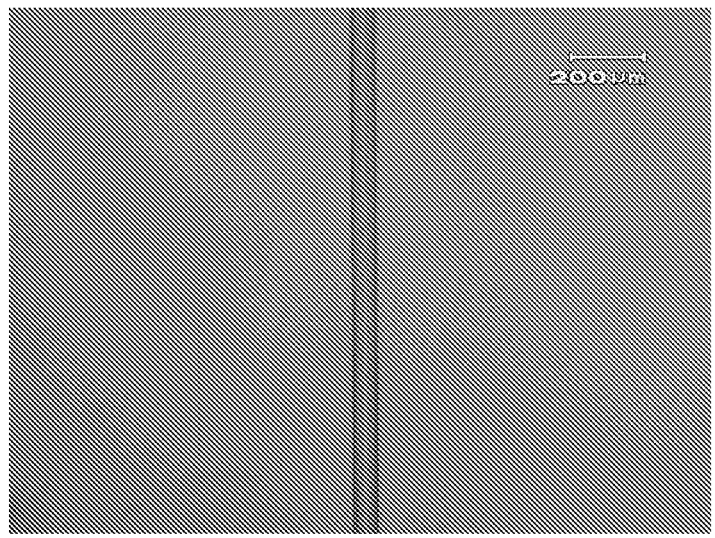
FIG. 14 is an optical micrograph of a patterned substrate of Example 7.

The polymeric substrate was air dried to evaporate the decane. After most of the decane had been evaporated, a least a portion of the water of the brilliant blue dye solution evaporated upon standing at room temperature. The brilliant blue dye of the solution remained in and in contact with the recessed surfaces of the recessed features of the polymeric substrate. An optical micrograph recorded in transmission of FIG. 14 illustrates the brilliant blue dye (that is, dark regions) residing in the recessed features of the structured surface region.

Various modifications and alterations of this disclosure will be apparent to those skilled in the art without departing from the scope and spirit of this disclosure, and it should be understood that this disclosure is not limited to the illustrative elements set forth herein.

What is claimed is:

1. A method of forming a patterned substrate comprising:
providing a substrate having a structured surface region comprising one or more recessed features;
disposing a first liquid onto at least a portion of the structured surface region, wherein the first liquid comprises a metal, a metal precursor, an electroless plating catalyst, an electroless plating catalyst precursor, a mask material, or a combination thereof;
contacting the first liquid with a second liquid; and
displacing the first liquid with the second liquid from at least a portion of the structured surface region, the first liquid selectively located in at least a portion of the one or more recessed features.

2. The method of claim 1, wherein the first liquid comprises a metal, or a metal precursor.

3. The method of claim 2, wherein the first liquid comprises a conductive ink.

4. The method of claim 2, wherein the conductive ink comprises a polymeric material.

5. The method of claim 4, further comprising curing the polymeric material after selectively placing the first liquid in at least a portion of the one or more recessed features.

6. The method of claim 1, wherein the first liquid comprises an electroless plating catalyst.

7. The method of claim 1, wherein the first liquid comprises an electroless plating catalyst precursor.

8. The method of claim 7, further comprising heating the electroless plating catalyst precursor after selectively placing the first liquid in at least a portion of the one or more recessed features to form an electroless plating catalyst.

9. The method of claim 1, wherein the first liquid comprises a mask material.

10. The method of claim 9, further comprising curing the mask material after selectively placing the first liquid in at least a portion of the one or more recessed features.

11. The method of claim 9, further comprising depositing a metal layer on the mask material and the structured surface region.

12. The method of claim 11, further comprising removing i) the metal layer deposited on the mask material, and ii) the mask material selectively located in at least a portion of the one or more recessed features.

13. The method of claim 1, further comprising backfilling the recessed features with an adhesive or a refractive index matching material.

14. A method of forming a patterned substrate comprising:
providing a substrate having a metallized structured surface region comprising a metal layer disposed on the substrate, the metallized structured surface region comprising one or more recessed features and a surface region complementary to the one or more recessed features;
disposing a first liquid onto at least a portion of the metallized structured surface region;
contacting the first liquid with a second liquid;
displacing the first liquid with the second liquid from at least a portion of the metallized structured surface region, the first liquid selectively located in at least a portion of the one or more recessed features; and
dissolving at least a portion of the metal layer into the second liquid selectively from the surface region complementary to the one or more recessed features.

15. The method of claim 14, wherein the second liquid comprises water and an etchant.

16. The method of claim 14, wherein the first liquid converts to a solid after the first liquid is selectively located in at least a portion of the one or more recessed features.

17. The method of claim 14, further comprising removing the first liquid from at least a portion of the one or more recessed features after dissolving at least a portion of the metal layer into the second liquid selectively from the surface region complementary to the one or more recessed features.

18. The method of claim 14, further comprising backfilling the recessed features with an adhesive or a refractive index matching material.

19. The method of claim 18, wherein the substrate comprises a microreplicated substrate.

20. A method of forming a patterned substrate comprising:
providing a substrate having a structured surface region comprising one or more recessed features;
disposing a first liquid onto at least a portion of the structured surface region;
contacting the first liquid with a second liquid; and
displacing the first liquid with the second liquid from at least a portion of the structured surface region, the first liquid selectively located in at least a portion of the one or more recessed features, wherein the first liquid converts to a solid after the first liquid is selectively located in at least a portion of the one or more recessed features.

* * * * *